(12) United States Patent
Hukushima et al.

(10) Patent No.: US 9,781,836 B2
(45) Date of Patent: Oct. 3, 2017

(54) THERMOSETTING RESIN COMPOSITION, METHOD FOR FORMING PROTECTIVE FILM FOR FLEXIBLE WIRING BOARD, AND FLEXIBLE WIRING BOARD

(75) Inventors: Iori Hukushima, Hitachi (JP); Tomohiro Hirata, Hitachi (JP); Hidekazu Kondou, Hitachi (JP); Susumu Kaneko, Hitachi (JP); Satoshi Uehara, Hitachi (JP); Yuki Miyamoto, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 486 days.

(21) Appl. No.: 13/499,928

(22) PCT Filed: Oct. 5, 2010

(86) PCT No.: PCT/JP2010/067458
§ 371 (c)(1),
(2), (4) Date: May 21, 2012

(87) PCT Pub. No.: WO2011/043342
PCT Pub. Date: Apr. 14, 2011

(65) Prior Publication Data
US 2012/0217045 A1    Aug. 30, 2012

(30) Foreign Application Priority Data
Oct. 7, 2009    (JP) .................. 2009-233700

(51) Int. Cl.
| | |
|---|---|
| H05K 1/03 | (2006.01) |
| H05K 3/28 | (2006.01) |
| C08G 18/00 | (2006.01) |
| C08G 18/08 | (2006.01) |
| C08G 18/12 | (2006.01) |
| C08G 18/32 | (2006.01) |
| C08G 18/34 | (2006.01) |
| C08G 18/40 | (2006.01) |
| C08G 18/44 | (2006.01) |
| C08G 18/64 | (2006.01) |
| C08G 18/65 | (2006.01) |
| C08G 18/66 | (2006.01) |
| C08G 18/75 | (2006.01) |
| C08G 18/76 | (2006.01) |
| C08G 18/80 | (2006.01) |
| C08G 18/82 | (2006.01) |
| C08J 3/24 | (2006.01) |
| C08K 5/00 | (2006.01) |
| C08L 75/00 | (2006.01) |
| C08L 75/04 | (2006.01) |

(52) U.S. Cl.
CPC ............ *H05K 3/285* (2013.01); *C08G 18/00* (2013.01); *C08G 18/0823* (2013.01); *C08G 18/12* (2013.01); *C08G 18/3212* (2013.01); *C08G 18/348* (2013.01); *C08G 18/4081* (2013.01); *C08G 18/44* (2013.01); *C08G 18/6438* (2013.01); *C08G 18/65* (2013.01); *C08G 18/6588* (2013.01); *C08G 18/66* (2013.01); *C08G 18/664* (2013.01); *C08G 18/6633* (2013.01); *C08G 18/758* (2013.01); *C08G 18/7607* (2013.01); *C08G 18/8061* (2013.01); *C08G 18/82* (2013.01); *C08J 3/24* (2013.01); *C08K 5/0025* (2013.01); *C08L 75/00* (2013.01); *C08L 75/04* (2013.01); *C08J 2375/04* (2013.01); *C08L 2203/206* (2013.01); *C08L 2312/00* (2013.01); *H05K 1/0393* (2013.01)

(58) Field of Classification Search
CPC ........ C08G 18/00; C08G 18/44; C08G 18/60; C08G 18/0823; C08G 18/3212; C08G 18/348; C08G 18/65; C08G 18/6438; C08G 18/6588; C08G 18/66; C08G 18/6633; C08G 18/664; C08G 18/82; C08G 18/12; C08G 18/4081; C08G 18/758; C08G 18/7607; C08G 18/8061; C08J 3/24; C08J 2375/04; C08K 5/0025; C08L 75/00; C08L 75/04; C08L 2203/206; C08L 2312/00; H05K 1/0393; H05K 3/285
USPC ........ 524/589, 590; 525/452, 453, 454, 462, 525/467; 528/44, 65, 8, 5
See application file for complete search history.

(56) References Cited

U.S. PATENT DOCUMENTS

| | | | |
|---|---|---|---|
| 6,617,048 B1 | 9/2003 | Yoshida et al. | |
| 2007/0293636 A1* | 12/2007 | Kimura et al. | ............... 525/453 |
| 2009/0099283 A1* | 4/2009 | Ishihara et al. | ............... 524/107 |

FOREIGN PATENT DOCUMENTS

| | | |
|---|---|---|
| CN | 1637034 | 7/2005 |
| CN | 101023112 | 8/2007 |
| CN | 101153192 | 4/2008 |
| JP | 62-106960 | 5/1987 |
| JP | H06-316894 | 11/1994 |
| JP | 07-196798 | 8/1995 |

(Continued)

OTHER PUBLICATIONS

Korean Official Action dated Mar. 28, 2014, for KR Application No. 10-2012-7008956.
Chinese Official Action dated Jan. 14, 2013, for CN Application No. 201080044754.7.
English translation of the International Preliminary Report on Patentability, including the Written Opinion of the International Searching Authority, dated May 18, 2012, for International (PCT) Application No. PCT/JP2010/067458.
Official Action dated Mar. 24, 2015, in JP 2011-535402.
Notice of Allowance dated Feb. 2, 2016, for Japanese Application No. 2011-535402.
Notice of Information Provision dated Jan. 5, 2016, for Japanese Application No. 2015-105822.

*Primary Examiner* — Patrick Niland
(74) *Attorney, Agent, or Firm* — Fitch Even Tabin & Flannery LLP

(57) ABSTRACT

A thermosetting resin composition which contains a polyurethane resin and a curing agent, the polyurethane resin including a constitutional unit derived from an alicyclic diol and having an acid value of 10 to 35 mgKOH/g.

24 Claims, 1 Drawing Sheet

(56) References Cited

FOREIGN PATENT DOCUMENTS

| JP | 08-012763 | 1/1996 |
| JP | 2001-009356 | 1/2001 |
| JP | 2001-009366 | 1/2001 |
| JP | 2006-117922 | 5/2006 |
| JP | 2006-124681 | 5/2006 |
| JP | 2006-283009 A | 10/2006 |
| JP | 2007-194290 A | 8/2007 |
| KR | 10-2007-0117581 | 12/2007 |

* cited by examiner

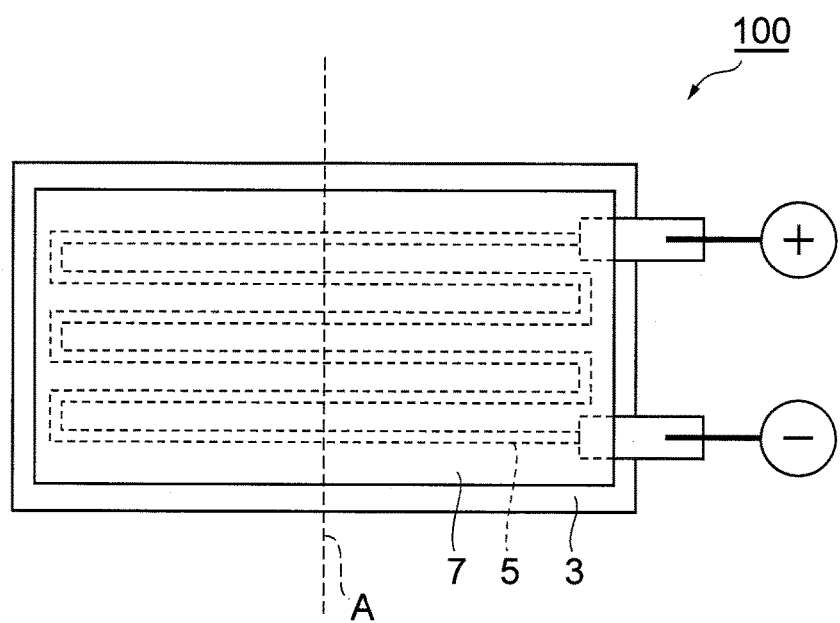

THERMOSETTING RESIN COMPOSITION, METHOD FOR FORMING PROTECTIVE FILM FOR FLEXIBLE WIRING BOARD, AND FLEXIBLE WIRING BOARD

TECHNICAL FIELD

The present invention relates to a thermosetting resin composition, a method for forming a protective film for a flexible wiring board, and a flexible wiring board.

BACKGROUND ART

In recent years, in the field of electronic components, resin compositions (for example, sealing agents, solder resist, etc.) for use in the electronic components have been required to have better heat resistance, electrical properties, and moisture resistance in order to deal with reduction in size, reduction in thickness, and increase in speed. Therefore, polyimide resins, polyamideimide resins, and polyamide resins have been used as resins constituting the resin compositions, in place of epoxy resins. However, these resins have a rigid resin structure, and the cured films lack flexibility. Therefore, the case of using the resins for thin film base materials has problems such as significant warpage of the base materials after curing, and poor flexibility.

For the resins mentioned above, in order to improve the warpage behavior and flexibility, it has been also previously considered that the resins are modified to provide flexibility and reduce the elastic modulus, and various types of modified polyamideimide resins have been proposed (see, for example, Patent Literatures 1, 2, and 3).

On the other hand, Patent Literature 4 discloses a thermosetting resin composition which is improved in small warpage behavior, flexibility, solder heat resistance, and tin plating resistance.

CITATION LIST

Patent Literature

[Patent Literature 1] Japanese Patent Application Laid-Open Publication No. Sho-62-106960
[Patent Literature 2] J Japanese Patent Application Laid-Open Publication No. Hei-8-12763
[Patent Literature 3] Japanese Patent Application Laid-Open Publication No. Hei-7-196798
[Patent Literature 4] Japanese Patent Application Laid-Open Publication No. 2006-117922

SUMMARY OF INVENTION

Technical Problem

However, in regard to resins for forming protective films for flexible wirings, the conventional resin compositions improved in terms of warpage behavior and flexibility are likely to cause the ingress of water molecules at high temperature and high humidity, and thus have difficulty with maintaining high levels of electrical properties. While it is believed that it is effective to provide the resin compositions with high glass transition temperatures by introducing a rigid constituent into the resin structures in order to provide high levels of electrical properties, according to this approach, cured base materials are likely to cause significant warpage, and cause problems such as poor flexibility.

In addition, while the thermosetting resin composition disclosed in Patent Literature 4 is found to be improved to some extent in terms of small warpage behavior, flexibility, solder heat resistance, and tin plating resistance, the considerations made by the present inventors have revealed that there is still room for improvement in terms of electrical properties (insulation reliability).

Therefore, a main object of the present invention is to provide a thermosetting resin composition which sufficiently suppresses warpage and also has excellent flexibility while maintaining high insulation reliability, when the thermosetting resin forms a protective film for a flexible wiring board.

Solution to Problem

The present invention relates to a thermosetting resin composition containing: a polyurethane resin including a constitutional unit derived from an alicyclic diol and having an acid value of 10 to 35 mgKOH/g; and a curing agent.

The thermosetting resin composition according to the present invention can form a protective film for a flexible wiring board, which sufficiently suppresses warpage and also has excellent flexibility while maintaining high insulation reliability. Accordingly, the thermosetting resin composition according to the present invention is suitable for a protective film for a flexible wiring board.

The polyurethane resin preferably has an amide linkage (amide group) and/or an imide linkage (imide group).

The polyurethane resin preferably further includes a monomer unit derived from a polycarbonatediol represented by the following formula (2). In the formula (2), R represents an alkylene group having 1 to 18 carbon atoms, and m represents an integer of 1 to 30.

[Chemical Formula 1]

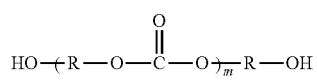

(2)

In another aspect, the present invention relates to a method for forming a protective film for a flexible wiring board. The method according to the present invention include the steps of printing the thermosetting resin composition according to the present invention so as to cover at least a portion of a wiring pattern of the flexible wiring board, the wiring pattern being subjected to a Sn plating processing in advance; and curing the printed thermosetting resin composition to form a protective film.

The method according to the present invention can form a protective film which sufficiently suppresses warpage and has excellent flexibility while maintaining high insulation reliability In yet another aspect, the present invention relates to a flexible wiring board including a protective film formed by the method described above.

Advantageous Effects of Invention

According to the present invention, a thermosetting resin composition is provided which sufficiently suppresses warpage and also has excellent flexibility while maintaining high insulation reliability, when a protective film for a flexible wiring board is formed.

BRIEF DESCRIPTION OF DRAWINGS

FIG. 1 is a plan view illustrating an embodiment of a flexible wiring board.

DESCRIPTION OF EMBODIMENTS

Preferred embodiments of the present invention will be described below in detail. However, the present invention is not to be considered limited to the following embodiments.

A thermosetting resin composition according to the present embodiment contains a polyurethane resin including a constitutional unit derived from an alicyclic diol. In the present invention, the polyurethane resin preferably further has an amide linkage and/or an imide linkage. The polyurethane resin can be synthesized by, for example, the following two methods.

(1) A diol including an alicyclic diol or a polycarbonatediol having a constitutional unit derived from an alicyclic diol is reacted with a polyisocyanate having an isocyanate group to obtain a polyisocyanate having an urethane linkage, and this polyisocyanate is reacted with an acid anhydride.

(2) A diol including an alicyclic diol or a polycarbonatediol having a constitutional unit derived from an alicyclic diol and a dihydroxy compound having a carboxyl group is reacted with a polyisocyanate having an isocyanate group.

In the synthesis method (1), a diol selected from polycarbonatediols having alicyclic diols and constitutional units derived from alicyclic diols is first reacted with a polyisocyanate having an isocyanate group to synthesize a polyisocyanate having an alicyclic skeleton and an urethane linkage (hereinafter, referred to as a "compound (A-1)").

The alicyclic diol preferably includes at least one selected from, for example, five-membered ring diols such as 1,2-cyclopentanedimethanol, 1,3-cyclopentanedimethanol and bis(hydroxymethyl)tricyclo[5.2.1.0]decane, and, six-membered ring diols such as 1,2-cyclohexanediol, 1,3-cyclohexanediol, 1,4-cyclohexanediol, 1,2-cyclohexanedimethanol, 1,3-cyclohexanedimethanol, 1,4-cyclohexanedimethanol and 2,2-bis(4-hydroxycyclohexyl)propane. Among these diols, 1,2-cyclohexanedimethanol, 1,3-cyclohexanedimethanol, and 1,4-cyclohexanedimethanol are preferred, and 1,4-cyclohexanedimethanol is particularly preferred.

The 1,4-cyclohexanedimethanol is a product industrially produced, and thus easily available, and moreover, has advantages such as that a polyurethane resin with a high degree of polymerization is likely to be obtained because it is highly reactive due to the methylol groups at the para position, and the obtained polyurethane resin has a high glass transition temperature. The ratio (molar ratio) between trans and cis of 1,4-cyclohexanedimethanol is typically 60/40 to 100/0.

Examples of the polycarbonatediol including a constitutional unit derived from an alicyclic diol include, for example, compounds represented by the following formula (1A) and compounds represented by the following formula (1B).

[Chemical Formula 2]

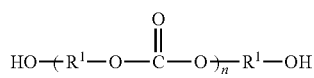

(1A)

In the formula (1A), $R^1$ represents a divalent organic group including an alicyclic hydrocarbon group having 5 to 10 carbon atoms, and n represents an integer of 1 to 30. The $R^1$ contained in the same molecule may be identical or different. Examples of $R^1$ include, for example, a 1,4-cyclohexanedimethanol residue (that is, a moiety of 1,4-cyclohexanedimethanol excluding two OH therefrom). The compound represented by the formula (1A) is commercially available as, for example, "UC-100" from Ube Industries, Ltd.

[Chemical Formula 3]

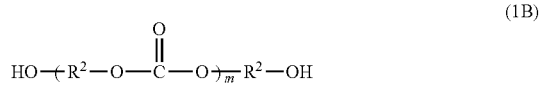

(1B)

In the formula (1B), $R^2$ represents a divalent organic group including an alicyclic hydrocarbon group having 5 to 10 carbon atoms, or an alkylene group having 1 to 18 carbon atoms. The plurality of $R^2$ contained in one molecule may be identical or different, and at least one of the plurality of $R^2$ is a divalent organic group including an alicyclic hydrocarbon group having 5 to 10 carbon atoms. m represents an integer of 1 to 30.

The compound represented by the formula (1B) can be, for example, a copolymerized carbonate diol including, as $R^2$, a constitutional unit derived from a diol including a divalent organic group having an alicyclic hydrocarbon group and a constitutional unit derived from a diol including an alkylene group having 1 to 18 carbon atoms. In this case, the molar ratio of the constitutional unit derived from the diol including the alkylene group to the constitutional unit derived from the diol including the divalent organic group having the alicyclic hydrocarbon group is preferably 0.3 to 3. This molar ratio within the range achieves particularly excellent electrical properties and folding endurance. From the same point of view, this molar ratio is more preferably 0.5 to 2.5, and further preferably 0.75 to 2.25.

It is preferable that the diol including the divalent organic group having the alicyclic hydrocarbon group is 1,4-cyclohexanedimethanole, and the diol including an alkylene group having 1 to 18 carbon atoms is 1,6-hexanediol. In other words, the compound represented by the formula (1B) is preferably a copolymerized carbonate diol which is a copolymer of 1,4-cyclohexanedimethanole and 1,6-hexanediol. The copolymerized carbonate diol with a molar ratio of 3/1 between 1,4-cyclohexanedimethanole and 1,6-hexanediol is commercially available as a trade name "UM-CARB90 (3/1)" from Ube Industries, Ltd., the copolymerized carbonate diol with a molar ratio of 1/1 between 1,4-cyclohexanedimethanole and 1,6-hexanediol is commercially available as a trade name "UM-CARB90 (1/1)" from Ube Industries, Ltd., and the copolymerized carbonate diol with a molar ratio of 1/3 between 1,4-cyclohexanedimethanole and 1,6-hexanediol is commercially available as a trade name "UM-CARB90 (1/3)" from Ube Industries, Ltd.

The alicyclic skeleton of the alicyclic diol may be, for example, a monocyclic skeleton such as a three-membered ring, a four-membered ring, a five-membered ring, a six-membered ring, and a seven-membered ring, or may be a polycyclic skeleton such as a bicyclo ring, a tricyclo ring, and a Spiro ring. The alicyclic skeleton of six-membered ring, in general, has a chair conformation as represented by the following formula. In the case of having two substitutions, the alicyclic skeleton stereochemically has a cis- or trans-structure. In the case of 1,4-cyclohexane derivative having substitutions at 1-position and 4-position, the substituents are preferably arranged in cis-position, from the standpoint of ensuring that electrical properties can be further improved. In the case of 1,3-cyclohexane derivative having substitution at 1-position and 3-position, the substituents are preferably arranged in trans-position. More specifically, the alicyclic skeleton preferably has a sterically non-linear structure as much as possible.

[Chemical Formula 4]

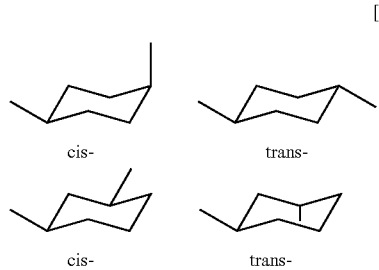

cis-    transcis-    trans-

For example, in the case of 1,4-cyclohexane derivative (such as 1,4-cyclohexanedimethanol), the ratio of cis:trans is preferably 100:0 to 70:30 or 0:100 to 30:70, and more preferably 70:30 to 30:70 from the standpoint of small warpage behavior.

The ratio of the constitutional unit derived from the alicyclic diol is preferably 0.1 to 30 mass % to the total mass of the polyurethane resin, from the standpoint of ensuring that characteristics such as an increase in glass transition temperature and an improvement in elastic modulus are likely to be provided, and electrical properties can be improved. This ratio less than 0.1 mass tends to reduce the effect of improvement in electrical properties, whereas the ratio greater than 30 mass % improves crystallinity to tend to decrease the solubility of the polyurethane resin in a solvent. From the same point of view, this ratio is more preferably 3 to 25 mass %, and particularly preferably 5 to 25 mass %. In the calculation of the ratio, "the constitutional unit derived from the alicyclic diol" refers to a moiety of the alicyclic diol excluding two hydroxyl groups therefrom. For example, when the alicyclic diol is 1,4-cyclohexanedimethanol, a moiety of the 1,4-cyclohexanedimethanol excluding two hydroxyl groups therefrom is regarded as "the constitutional unit derived from the alicyclic diol", and the ratio of the moiety is calculated.

The polyurethane resin having the alicyclic skeleton leads to the suppression of molecular motions, thereby making it likely that characteristics are provided such as an increase in glass transition temperature and an improvement in elastic modulus, and making it possible to improve the electrical properties (insulation reliability) of the protective film.

The diol to be reacted with the polyisocyanate may further include, in addition to the polycarbonatediol having an alicyclic diol or a constitutional unit derived from an alicyclic diol, a diol compound except the polycarbonatediol. Examples of this diol compound include, for example, a polybutadienediol, a polyisoprenediol, a polycarbonatediol including a constitutional unit derived from an aliphatic diol, a polyetherdiol, a polyesterdiol, a polycaprolactonediol, a silicone diol, and a dihydroxy compound having a carboxyl group. From the standpoint of ensuring that the small warpage behavior and flexibility can be improved, the polycarbonatediol including a constitutional unit derived from an aliphatic diol is preferred, which is represented by the following formula (2). In the formula (2), R represents an alkylene group having 1 to 18 carbon atoms, and m represents an integer of 1 to 30.

[Chemical Formula 5]

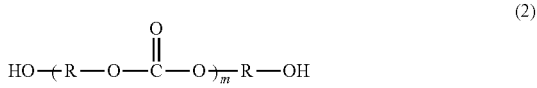

The polycarbonatediol represented by the formula (2) preferably has a number average molecular weight of 500 to 5000, more preferably 750 to 4000, and particularly preferably 1000 to 3000.

Examples of the polycarbonatediol represented by the formula (2) include, for example, α,ω-poly(hexamethylenecarbonate)diol and α,ω-poly(3-methyl-pentamethylenecarbonate)diol. Commercially available polycarbonatediols include PLACCEL CD-205, 205PL, 205HL, 210, 210PL, 210HL, 220, 220PL, 220HL (trade names) from Daicel Chemical Industries, Ltd., PCDL T-5651, T-5652, T-6001, T-6002, G-3452, PCDX-55 (trade names) from Asahi Kasei Chemicals Corporation, and UH-50, 100, 200, 300, UHC-50-100, UHC-50-200 from Ube Industries, Ltd. These polycarbonatediols can be used singly or in combinations of two or more.

A triol compound having three hydroxy groups can be also used in combination with the diol. Examples of the triol compound include 1,2,3-propanetriol (glycerin) and 1,2,4-butanetriol. As described above, when a compound is used which has three hydroxyl groups and has functional groups different in reactivity, such as a primary hydroxy group and a secondary hydroxy group, a polyurethane resin having a hydroxy group can be synthesized.

Examples of the polyisocyanate to be reacted with the diol include, for example, diisocyanate compounds represented by the following formula (4). In the formula (4), X represents a divalent organic group.

Examples of the divalent organic group represented by X in the formula (4) include, for example, alkylene groups having 1 to 20 carbon atoms, and; arylene groups such as phenylene groups and naphthylene groups which are unsubstituted or substituted with lower alkyl groups having 1 to 5 carbon atoms, such as a methyl group. The carbon numbers of the alkylene groups are more preferably 1 to 18. The divalent organic group represented by X is preferably selected from groups having an aromatic ring, such as a phenylene group, a xylylene group, a naphthylene group, a diphenylmethane-4,4'-diyl group, and a diphenylsulfone-4, 4'-diyl group. In addition, a hydrogenerated diphenylmethane-4,4'-diyl group is also preferred.

Examples of the diisocyanate compound represented by the formula (4) include, for example, diphenylmethane diisocyanate compounds and hydrogenerated products thereof, such as: diphenylmethane-2,4'-diisocyanate; 3,2'-, 3,3'-, 4,2'-, 4,3'-, 5,2'-, 5,3'-, 6,2'-, or 6,3'-dimethylphenylmethane-2,4'-diisocyanate; 3,2'-, 3,3'-, 4,2'-, 4,3'-, 5,2'-, 5,3'-, 6,2'-, or 6,3'-diethylphenylmethane-2,4'-diisocyanate; 3,2'-, 3,3'-, 4,2'-, 4,3'-, 5,2'-, 5,3'-, 6,2'-, or 6,3'-dimethoxydiphenylmethane-2,4'-diisocyanate; diphenylmethane-4,4'-diisocyanate; diphenylmethane-3,3'-diisocyanate; and diphenylmethane-3,4'-diisocyanate; diphenylether-4,4"-diisocyanate; benzophenone-4,4'-diisocyanate; diphenylsulphone-4,4'-diisocyanate; tolylene-2,4-diisocyanate; tolylene-2,6-diisocyanate; 2,4-tolylenediisocyanate; 2,6-tolylenediisocyanate; m-xylenediisocyanate; p-xylenediisocyanate; 1,5-naphthalenediisocyanate; and 4,4'-[2,2bis(4-phenoxyphenyl)propane]diisocyanate. It is preferable to use, like these diisocyanate compounds, the aromatic diisocyanate compound in which X in the formula (4) is a group having an aromatic ring. These diisocyanate compounds can be used singly or in combinations of two or more.

As the diisocyanate compound represented by the formula (4), without departing from the spirit of the present invention, aliphatic or alicyclic isocyanates can be used, such as hexamethylenediisocyanate, 2,2,4-trimethyl hexamethylenediisocyanate, isophorone diisocyanate, 4,4'-dicyclohexylmethanediisocyanate, trans cyclohexane-1,4-diisocyanate, hydrogenerated m-xylylenediisocyanate, and lysine diisocyanate. As the polyisocyanate, trifunctional or more polyisocyanates may be used, along with the diisocyanate compound represented by the formula (4).

The diisocyanate compound represented by the formula (4) may have an isocyanate group stabilized with a blocking agent in order to avoid variation per day. Examples of the blocking agent include, but not particularly limited to, hydroxy acrylates, alcohols typified by methanol, phenols, and oximes.

The reaction between the diol and the polyisocyanate can be developed by condensation of the diol and polyisocyanate through heating, in the presence of an organic solvent, preferably a polar solvent containing no nitrogen.

The polar solvent containing no nitrogen is selected from, for example, ether type solvents such as diethylene glycol dimethyl ether, diethylene glycol diethyl ether, triethylene glycol dimethyl ether, and triethylene glycol diethyl ether; sulfur-containing solvents such as dimethyl sulfoxide, diethyl sulfoxide, dimethyl sulfone, and sulfolane; ester type solvents such as γ-butyrolactone and cellosolve acetate; ketone type solvents such as cyclohexanone and methylethylketone; as well as aromatic hydrocarbon type solvents such as toluene and xylene. These solvents can be used singly or in combinations of two or more.

Among the solvents mentioned above, a solvent in which the produced resin is able to be dissolved is preferably selected and used. In addition, a solvent is preferably used which is preferred as a solvent for the thermosetting resin composition directly after the synthesis. Among the solvents mentioned above, the highly volatile ketone type solvents such as cyclohexanone and methylethylketone are particularly preferable, in order to develop the reaction in a homogeneous system efficiently.

The amount of the solvent used is preferably 0.8 to 5.0 times (mass ratio) with respect to the total amount of raw materials for the synthesis of the compound (A-1). If this used amount is less than 0.8 times, there is a tendency for the viscosity in the synthesis to be increased excessively to make the synthesis difficult due to the inability to carry out agitation, whereas if the amount is greater than 5.0 times, there is a tendency for the reaction rate to be decreased.

The reaction temperature is preferably 70 to 210° C., more preferably 75 to 190° C., and particularly preferably 80 to 180° C. If this temperature is less than 70° C., there is a tendency for the reaction time to be increased excessively, whereas if the temperature is higher than 210° C., there is a tendency for gelation to be likely to be developed during the reaction. The reaction time can be selected appropriately depending on the content of the reaction container and the reaction conditions adopted.

If necessary, the reaction may be developed in the presence of a catalyst such as tertiary amines, alkali metals, alkaline earth metals, metals such as tin, zinc, titanium, and cobalt, or semi-metallic compounds.

The blend ratio in the case of the reaction between the diol and the polyisocyanate is adjusted appropriately depending on the number average molecular weight of the produced compound (A-1), and on whether the produced compound (A-1) is terminated with a hydroxyl group or an isocyanate group.

In the case of synthesizing the compound (A-1) terminated with a hydroxyl group, the ratio between the number of hydroxyl groups and the number of isocyanate groups (the number of hydroxyl groups/the number of isocyanate groups) is preferably adjusted to 1.01 or more, and preferably adjusted to 2.0 or less.

In the case of synthesizing the compound (A-1) terminated with an isocyanate group, the ratio between the number of isocyanate groups and the number of hydroxyl groups (the number of isocyanate groups/the number of hydroxyl groups) is preferably adjusted to 1.01 or more, and preferably adjusted to 2.0 or less.

The number average molecular weight of the compound (A-1) is preferably 500 to 30000, more preferably 1000 to 25000, and particularly preferably 1500 to 20000.

The compound (A-1) itself can be used as a polyurethane resin having an alicyclic group and an urethane linkage. More preferably, the compound (A-1) which is terminated with a hydroxyl group or an isocyanate group is reacted with a carboxylic compound selected from: a dicarboxylic acid; a trivalent polycarboxylic acid having an acid anhydride group or a derivative thereof; and quadrivalent polycarboxylic acids having an acid anhydride group, to produce a polyurethane resin having an alicyclic group and an amide linkage and/or an imide linkage.

From the standpoint of ensuring that the chemical resistance and electronic properties can be improved, the compound (A-1) is preferably used which is terminated with an isocyanate group. The reaction of this compound (A-1) with the carboxylic compound mentioned above can easily synthesize a polyurethane resin having an amide linkage and/or an imide linkage in a polymer main chain.

The carboxylic acid is selected from, for example, but not particularly limited to, aliphatic dicarboxylic acids such as adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, octadecanedioic acid, and eicosanedioic acid; alicyclic dicarboxylic acids such as 1,3-cyclopentanedicarboxylic acid, 1,4-cyclohexanedicarboxylic acid, dicyclohexanemethane-4,4'-dicarboxylic acid, and norbornanedicarboxylic acid; and aromatic dicarboxylic acids such as isophthalic acid, terephthalic acid, 1,4-naphthalenedicarboxylic acid, 1,8-naphthalenedicarboxylic acid, 2,6-naphthalenedicarboxylic acid, and 2,7-naphthalenedicarboxylic acid.

While the trivalent polycarboxylic acid having an acid anhydride group and derivatives thereof are not particularly limited, examples thereof include, for example, compounds represented by the following formula (5) or (6).

[Chemical Formula 6]

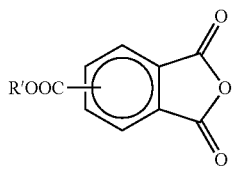
(5)

[Chemical Formula 7]

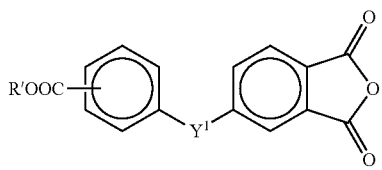
(6)

In the formulas (5) and (6), R' represents a hydrogen atom, an alkyl group having 1 to 10 carbon atoms or a phenyl group, and $Y^1$ represents —$CH_2$—, —CO—, —$SO_2$—, or —O—.

As the trivalent polycarboxylic acid having an acid anhydride group, trimellitic anhydride is particularly preferable in terms of cost, etc.

While the quadrivalent polycarboxylic acid having an acid anhydride group is also not particularly limited, examples thereof can include tetracarboxylic dianhydrides represented by the following formula (7). These polycarboxylic acids can be used singly or in combinations of two or more.

[Chemical Formula 8]

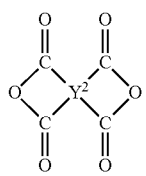
(7)

In the formula (7), $Y^2$ represents one tetravalent group selected from multiple groups represented by the following formula (8).

[Chemical Formula 9]
(8)

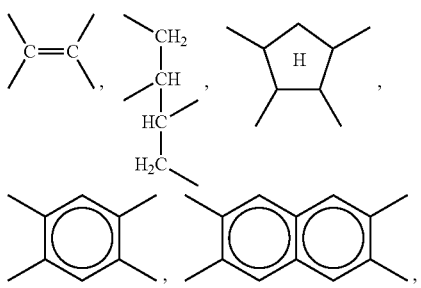

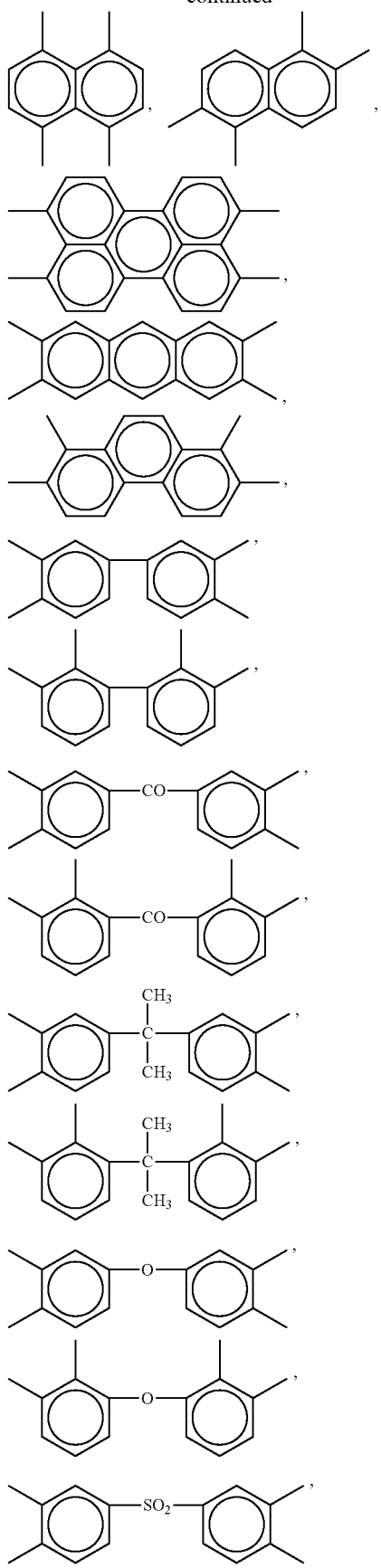

-continued

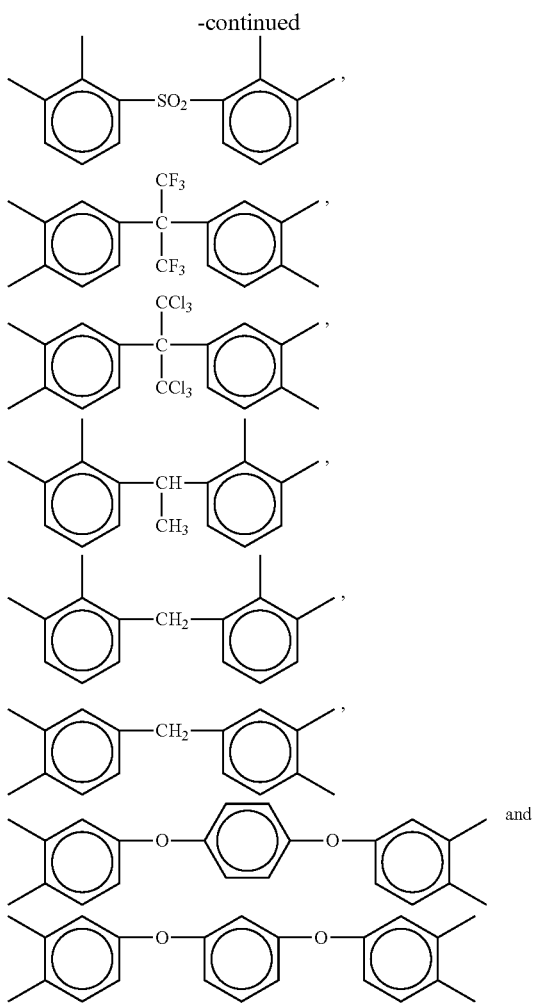

and

The carboxylic compound to be reacted with the (A-1) compound is at least one compound selected from the dicarboxylic acids, the trivalent polycarboxylic acids having an acid anhydride group or derivatives thereof, and the quadrivalent polycarboxylic acids having an acid anhydride group.

The compound (A-1) may be reacted with the carboxylic compound along with an isocyanate compound (hereinafter, referred to as a "compound (A-2)") except the compound (A-1), to obtain a polyurethane resin. The compound (A-2) is not particularly limited as long as the compound (A-2) is an isocyanate compound except the compound (A-1), and examples of the compound (A-2) include, for example, diisocyanate compounds represented by the above formula (4) and trivalent or more polyisocyanete compounds. These can be used singly or in combinations of two or more.

In the present embodiment, an amine compound can be also used in combination with the isocyanate compound. Examples of the amine compound include a compound in which the isocyanate group of the isocyanate compound is converted to an amino group. The conversion of the isocyanate group to the amino group can be carried out by a known method. The amine compounds have a number average molecular weight in the same preferable range as in the case of the above compound (A-1).

It is preferably the aromatic polyisocyanate that accounts for 50 to 100 mass % of the total amount of the compound (A-2). This aromatic polyisocyanate is, considering a balance among solubility, mechanical properties, cost, etc., particularly preferably 4,4'-diphenylmethanediisocyanate.

In the case of using the compound (A-1) and the compound (A-2) in combination, the equivalent ratio of compound (A-1)/compound (A-2) is preferably 0.1/0.9 to 0.9/0.1, more preferably 0.2/0.8 to 0.8/0.2, and particularly preferably 0.3/0.7 to 0.7/0.3. The equivalent ratio in this range can achieve more favorable adhesion with an object to be attached.

In the reaction between the carboxylic compound and the isocyanate compound, the ratio of the total number of carboxylic groups and acid anhydride groups to the total number of isocyanate groups in the isocyanate compound (the total number of carboxylic groups and acid anhydride groups/the total number of isocyanate groups) is preferably 0.6 to 1.4, more preferably 0.7 to 1.3, and particularly preferably 0.8 to 1.2. If this ratio is less than 0.6 or greater than 1.4, there is a tendency to make it difficult to increase the number average molecular weight of the polyurethane resin including an amide linkage and/or an imide linkage.

The polyurethane resin having an amide linkage and/or an imide linkage preferably has a number average molecular weight of 5000 to 65000, more preferably 6000 to 60000, and particularly preferably 7000 to 50000 or 7000 to 25000. The number average molecular weight less than 5000 tends to decrease the weather resistance or chemical resistance, whereas the number average molecular weight greater than 65000 tends to make it difficult to dissolve the polyurethane resin in polar solvents containing no nitrogen, and make the polyurethane resin insoluble during the synthesis.

In this specification, the number average molecular weight refers to a value obtained through the measurement by gel permeation chromatography (GPC) and the conversion with the use of a calibration curve of standard polystyrene. The number average molecular weight, weight average molecular weight, and degree of dispersion are defined as follows.

(a) Number Average Molecular Weight (Mn)

$$Mn=\Sigma(N_iM_i)/\Sigma N_i=\Sigma X_iM_i$$

($X_i$=Mole Fraction of Molecule of Molecular Weight $M_i$=$N_i$/$\Sigma N_i$)

(b) Weight Average Molecular Weight (Mw)

$$Mw=\Sigma(N_iM_i^2)/\Sigma N_iM_i=\Sigma W_iM_i$$

($W_i$=Weight Fraction of Molecule of Molecular Weight $M_i$=$N_iM_i$/$\Sigma N_iM_i$)

(c) Molecular Weight Distribution (Degree of Dispersion)

$$\text{Degree of Dispersion}=Mw/Mn$$

The acid value of the polyurethane resin is preferably 10 to 35 mgKOH/g. If the acid value of the polyurethane resin is greater than 35 mgKOH/g, there is a tendency to increase warpage, whereas if the acid value is less than 10 mgKOH/g, there is a tendency to decrease the weather resistance or flexibility because of insufficient curing. From the standpoint of ensuring that the small warpage behavior, thermosetting properties, and electrical properties can be improved, the acid value of the polyurethane resin is more preferably 13 to 33 mgKOH/g, and even more preferably 15 to 33 mgKOH/g.

The acid value of the polyurethane resin can be measured by the following method. First, approximately 1 g of a polyurethane resin solution is weighed precisely. Then, to this polyurethane resin solution, 30 g of a mixed solvent with isopropyl alcohol/toluene=1/2 (mass ratio) is added to achieve uniform dissolution. An appropriate amount of phenolphthalein as an indicator is added to the obtained solution, and titration is carried out with the use of a 0.1 N of KOH solution (alcoholic). Then, the titration result is used to calculate the acid value from the following formula (1):

$$A=10 \times Vf \times 56.1/(Wp \times I) \tag{1}$$

In the formula (I), A represents an acid value (mgKOH/g), Vf represents the titer (mL) of the 0.1 N of KOH solution, Wp represents the mass (g) of the polyurethane resin solution, and I represents the proportion (mass %) of nonvolatile content in the polyurethane resin solution.

Next, the synthesis method for the polyurethane resin (2) will be described. In the synthesis method (2), a diol including a polycarbonatediol having an alicyclic diol or a constitutional unit derived from an alicyclic diol and a dihydroxy compound having a carboxyl group is reacted with a polyisocyanate having an isocyanate group to obtain a polyurethane resin.

For the polycarbonatediol having an alicyclic diol or a constitutional unit derived from an alicyclic diol and the compound having an isocyanate group, the same compounds as described in the synthesis method (1) can be used. Other diol compounds can also be used, except the polycarbonatediol having an alicyclic diol or a constitutional unit derived from an alicyclic diol. For these diol compounds, the compounds described in the synthesis method (1) can be used.

Examples of the dihydroxy compound having a carboxyl group include, for example, compounds represented by the following general formula (3). In the formula (3), $R^3$ represents an alkyl group having 1 to 5 carbon atoms.

[Chemical Formula 10]

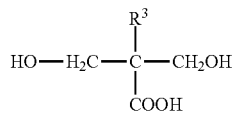

(3)

Examples of the compounds represented by the formula (3) include, for example, a dimethylolpropionic acid and a dimethylolbutanic acid.

The reaction of the diol including the polycarbonatediol having an alicyclic diol or a constitutional unit derived from an alicyclic diol and the dihydroxy compound having a carboxyl group with the polyisocyanate having an isocyanate group can be developed under the same conditions as in the case of the compound (A-1) described in the synthesis method (1). Thus, the polyurethane resin according to the synthesis method (2) can be obtained.

The thus obtained polyurethane resin preferably has a number average molecular weight of 5000 to 65000, more preferably 6000 to 60000, and particularly preferably 7000 to 50000 or 7000 to 25000. The number average molecular weight less than 5000 tends to decrease the weather resistance or chemical resistance, whereas the number average molecular weight greater than 65000 tends to make it difficult to dissolve the polyurethane resin in polar solvents containing no nitrogen, and make the polyurethane resin insoluble during the synthesis.

The use of the compound represented by the formula (3) can easily achieve polyurethane resins which preferably have an acid value of 10 to 35 mgKOH/g, more preferably 13 to 33 mgKOH/g, and even more preferably 15 to 33 mgKOH/g. The content of the compound represented by the formula (3) is preferably adjusted so as to provide the acid value mentioned above.

The polyurethane resin is preferably a polyurethane resin obtained by the synthesis method (1), which has no carboxyl group in a side chain and has a carboxyl group or an acid anhydride group at an end. The electric properties can be further improved by having a carboxyl group or an acid anhydride group at an end of a molecule and introducing an amide linkage and/or an imide linkage. From the standpoint of ensuring that the flexibility can also be further improved, polyurethane resins are particularly preferred which have a carboxyl group or an acid anhydride group at an end of a molecule, and have an amide linkage and an imide linkage. The presence of a lot of carboxyl groups in a side chain tend to, in the case of a reaction with a curing agent, decrease the weather resistance because of having a lot of ester linkages, and furthermore, because of a lot of cross-linkage in molecular chains, make the ingress of water molecules likely to be caused, thereby resulting in a decrease in the electrical properties.

The thermosetting resin composition according to the present embodiment preferably further contains a curing agent for curing the polyurethane resin. As the curing agent, an epoxy resin or a polyisocyanate compound can be used.

Examples of the epoxy resin include, for example, bisphenol A epoxy resins (Trage Name "EPIKOTE 828" from Yuka Shell Epoxy Kabushiki Kaisha, etc.), bisphenol F epoxy resins (Trade Name "YDF-170" from Tohto Kasei Co., Ltd., etc.), phenol novolac epoxy resins (Trade Names "EPIKOTE 152, 154" from Yuka Shell Epoxy Kabushiki Kaisha; Trade Name "EPPN-201" from Nippon Kayaku Co., Ltd.; Trade Name "DEN-438" from The Dow Chemical Company, etc.), o-cresol novolac epoxy resins (Trade Names "EOCN-125S, 103S, 104S" from Nippon Kayaku Co., Ltd., etc.), multifunctional epoxy resins (Trade Name "Epon1031S" from Yuka Shell Epoxy Kabushiki Kaisha; Trade Name "Araldite 0163" from Ciba Specialty Chemicals Inc.; Trade Name "DENACOL EX-611, EX-614, EX-614B, EX-622, EX-512, EX-521, EX-421, EX-411, EX-321" from Nagase Chemicals Ltd., etc.); amine epoxy resins (Trade Name "EPIKOTE 604" from Yuka Shell Epoxy Kabushiki Kaisha; Trade Names "YH-434", "YH-434L" from Tohto Kasei Co., Ltd.; Trade Names "TETRAD-X", "TERRAD-C" from Mitsubishi Gas Chemical Company, Inc.; Trade Name "GAN" from Nippon Kayaku Co., Ltd.; Trade Name "ELM-120" from Sumitomo Chemical Co., Ltd., etc.), heterocyclic ring-containing epoxy resins (Trade Name "Araldite PT810" from Ciba Specialty Chemicals Inc., etc.), alicyclic epoxy resins (Trade Names "ERL4234, 4299, 4221, 4206" from UCC, etc.), and epoxy resins having a dicyclopentadiene skeleton (Trade Names "HP-7200", "HP-7200H" from Dainippon Ink and Chemicals Inc.). These epoxy resins can be used singly or in combinations of two or more. Among these epoxy resins, the amine epoxy resins having three or more epoxy groups are particularly preferred in terms of improvements in solvent resistance, chemical resistance, and moisture resistance. Examples of the preferred epoxy resins having three or more epoxy groups include, for example, tetraglycidyldiaminodiphenylmethane.

Examples of the polyisocyanate compound include, for example, the diisocyanate compounds represented by the above formula (4), trifunctional isocyanates, and other tetrafunctional or more isocyanates. In view of variation per day in the case of mixing the polyurethane resin with the curing agent, it is preferable to use a polyisocyanate compound with an isocyanate group stabilized with a blocking agent. Examples of the blocking agent include, but not particularly limited to, alcohols, phenols, and oximes. Examples of this blocked isocyanate include, for example, Trade Names "DURANATE17B-60PX, TPA-B80E, MF-B60X, MF-K60X, E402-B80T" from Asahi Kasei Chemicals Corporation, Trade Names "Karenz MOI-BM, MOI-BP" from Showa Denko K.K., Trade Names "BL-3175, BL-4165, Desmocap11, Desmocap-12" from Sumitomo Bayer Urethane Co., Ltd. The blocked isocyanate is preferably selected according to the thermal curing temperature of the polyurethane resin, and in the case of low-temperature curing, BL-3175 is particularly preferred.

As the curing agent, it is possible to use epoxy resins and polyisocyanate compounds alone or use the resins and compounds in combination, the curing agent can be selected according to a reactive group of the polyurethane resin. For example, when the polyurethane resin has a hydroxy group, the blocked isocyanate is preferably used, and when polyurethane resin has a carboxyl group or an amino group, the epoxy resin is preferably used. The curing agent is not limited to the epoxy resins and polyisocyanate compounds, as long as the curing agent reacts with the reactive group of the polyurethane resin.

The content rate of the curing agent is preferably 1 to 30 mass % to the total mass of the polyurethane resin including a constitutional unit derived from an alicyclic diol with an acid value of 10 to 35 mgKOH/g and the curing agent, more preferably 2 to 20 mass %, and particularly preferably 2.5 to 15 mass %. This content rate allows the cured film as a protective film to provide preferred electrical properties, warpage behavior, and weather resistance.

The thermosetting resin composition can contain an inorganic filler (inorganic filler) and/or an organic filler (organic filler), for the reasons such as improvement in thixotropy Index, film forming properties, weather resistance in the cured film, printing properties.

Examples of the inorganic filler include, for example, silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO$—$TiO_2$), barium carbonate ($BaCO_3$), lead titanate ($PbO$—$TiO_2$), lead zirconate titanate (PZT), lead lanthanum zirconate titanate (PLZT), gallium oxide ($Ga_2O_3$), spinel ($MgO$—$Al_2O_3$), mullite ($3Al_2O_3$-$2SiO_2$), cordierite ($2MgO$-$2Al_2O_3$/$5SiO_2$), talc ($3MgO$-$4SiO_2$—$H_2O$), aluminum titanate ($TiO_2$—$Al_2O_3$), yttria-containing zirconia ($Y_2O_3$—$ZrO_2$), barium silicate ($BaO$-$8SiO_2$), boron nitride (BN), calcium carbonate ($CaCO_3$), hydrotalcite, calcium sulfate ($CaSO_4$), zinc oxide (ZnO), magnesium titanate ($MgO$—$TiO_2$), barium sulfate ($BaSO_4$), organic bentonite, and carbon (C). These inorganic fillers can be used singly or in combinations of two or more. Among these inorganic fillers, in particular, silica ($SiO_2$) is preferred from the standpoints of screen printing properties and electrical properties. From the standpoint of ensuring that flame retardance can be improved, hydrotalcite is preferred.

The hydrotalcite is a double hydroxide represented by the following formula (18). In the formula (18), $M^1$ represents $Mg^{2+}$, $Fe^{2+}$, $Zn^{2+}$, $Ca^{2+}$, $Li^{2+}$, $Ni^{2+}$, $Co^{2+}$, or $Cu^{2+}$, $M^2$ represents $Al^{3+}$, $Fe^{3+}$, or $Mn^{3+}$, x represents an integer of 2 to 5, and n represents a positive integer.

$$M^1{}_{8-x}M^2{}_x(OH)_{16}CO_3\text{-}nH_2O \tag{18}$$

Among these hydroxides, the compounds containing magnesium and aluminum are particularly preferred which are represented by the following chemical composition formula.

$$Mg_6Al_2(OH)_{16}CO_3\text{-}4H_2O$$

This type of hydrotalcite is commercially available as HT-P (from Sakai Chemical Industry Co., Ltd., Trade Name).

As the organic filler, fine particles of a resin having an amide linkage, an imide linkage, an ester linkage, or an ether linkage (heat-resistance resin) are preferred. As this resin, fine particles of a polyimide resin or a precursor thereof, a polyamideimide resin or a precursor thereof, or a polyamide resin are preferably used from the standpoints of heat resistance and mechanical properties.

The resin as the organic filler can be produced in the following way. The polyimide resin can be obtained by reacting (i) aromatic tetracarboxylic dianhydride with (ii) an aromatic diamine compound.

Examples of the (i) aromatic tetracarboxylic dianhydride include, for example, pyromellitic dianhydride, 3,3',4,4'-biphenyltetracarboxylic dianhydride, 2,2',3,3'-bisphenyltetracarboxylic dianhydride, 2,2',3,3'-biphenyltetracarboxylic dianhydride, 2,3,3',4'-biphenyltetracarboxylic dianhydride, 2,2-bis(3,4-dicarboxyphenyl)propane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 2,3,3',4'-benzophenonetetracarboxylic dianhydride, 1,2,5,6-naphthalenetetracarboxylic dianhydride, 2,3,6,7-naphthalenetetracarboxylic dianhydride, 1,2,4,5-naphthalenetetracarboxylic dianhydride, 1,4,5,8-naphthalenetetracarboxylic dianhydride, 2,6-dichlomaphthalene-1,4,5,8-tetracarboxylic dianhydride, 2,7-dichlornaphthalene-1,4,5,8-tetracarboxylic dianhydride, 2,3,6,7-tetrachlornaphthalene-1,4,5,8-tetracarboxylic dianhydride, phenanthrene-1,8,9,10-tetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitic monoester acid anhydride), 2,2-bis(3,4-dicarboxyphenyl)hexafluoropropane dianhydride, 2,2-bis{4-(3,4-dicarboxyphenoxy)phenyl}hexafluoropropane dianhydride, 2,2-bis{4-(3,4-dicarboxyphenoxy)phenyl}propane dianhydride, 4,4-bis(3,4-dicarboxyphenoxy)diphenyl sulfide dianhydride, 1,4-bis(2-hydroxyhexafluoroisopropyl)benzenebis(trimellitate anhydride), 1,3-bis(2-hydroxyhexafluoroisopropyl)benzenebis(trimellitate anhydride), 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride). Two or more of these may be mixed and used.

In addition to the (i) aromatic tetracarboxylic dianhydride mentioned above, tetracarboxylic dianhydrides except the aromatic tetracarboxylic dianhydrides can be used depending on the purpose, in a range not to exceed 50 mol % of the aromatic tetracarboxylic dianhydride. Examples of this type of tetracarboxylic dianhydride include, for example, ethylenetetracarboxylic dianhydride, 1,2,3,4-butanetetracarboxylic dianhydride, pyrazine-2,3,5,6-tetracarboxylic dianhydride, thiophene-2,3,4,5-tetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis{exo-bicyclo[2,2,1]heptane-2,3-dicarboxylic anhydride}sulfone, bicyclo-(2,2,2)-octo(7)-en-2,3,5,6-tetracarboxylic dianhydride, 5-(2,5-dioxotetrahydrofuryl)-3-methyl-3-cyclohexane-1,2-dicarboxylic anhydride, and tetrahydrofuran-2,3,4,5-tetracarboxylic dianhydride.

Examples of the (ii) aromatic diamine compound include, for example, o-phenylenediamine, m-phenylenediamine, p-phenylenediamine, 3,3'-diaminodiphenylether, 4,4'-diaminodiphenylether, 3,4'-diaminodiphenylether, 3,3'-diaminodiphenylmethane, 3,4'-diaminodiphenylmethane, 4,4'-diaminodiphenylmethane, 3,3'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2-bis(3,4'-diaminophenyl)propane, 2,2-bis(4-aminophenyl)propane, 2,2-bis(3-aminophenyl)hexafluoropropane, 2,2-bis(3,4'-diaminophenyl)hexafluoropropane, 2,2-bis(4-aminophenyl)hexafluoropropane, 1,3-bis(3-aminophenyl)benzene, 1,4-bis(4-aminophenyl)benzene, 3,3'-[1,4-phenylenebis(1-methylethylidene)]bisaniline, 3,4'-[1,4-phenylenebis(1-methylethylidene)]bisaniline, 4,4'-[1,4-phenylenebis(1-methylethylidene)]bisaniline, 2,2-bis[4-(3-aminophenoxy)phenyl]propane, 2,2-bis[4-(4-aminophenoxy)phenyl]propane, 2,2-bis[4-(3-aminophenoxy)phenyl]hexafluoropropane, 2,2-bis[4-(4-aminophenoxy)phenyl]hexafluoropropane, bis[4-(3-aminophenoxy)phenyl]sulfide, bis[4-(4-aminophenoxy)phenyl]sulfide, bis[4-(3-aminophenoxy)phenyl]sulfone, and bis[4-(4-aminophenoxy)phenyl]sulfone. Two or more of these aromatic diamine compounds may be mixed and used.

In addition to the (ii) aromatic diamine compound mentioned above, diamine compounds except the aromatic diamine compounds can be used depending on the purpose, in a range not to exceed 50 mol % of the aromatic diamine compound. Examples of this type of diamine compound include, for example, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,3-bis(3-aminopropyl)tetramethyldisiloxane, and 1,3-bis(3-aminopropyl)tetramethylpolysiloxane.

The (i) aromatic tetracarboxylic dianhydride and the (ii) aromatic diamine compound are preferably reacted in an almost equimolar ratio in terms of film properties. The reaction between the (i) aromatic tetracarboxylic dianhydride and the (ii) aromatic diamine compound can be developed in an organic solvent. As the organic solvent, for example, nitrogen-containing compounds such as N-methyl-2-pyrrolidone, dimethylacetoamide, dimethylformamide, 1,3-dimethyl-3,4,5,6-tetrahydro-2(1H)-pyrimidinone, and 1,3-dimethyl-2-imidazolydinone; sulfur compounds such as sulfolane and dimethyl sulfoxide; lactones such as γ-butyrolactone, γ-valerolactone, γ-caprolactone, γ-heptalactone, α-acetyl-γ-butyrolactone, and ε-caprolactone; ethers such as dioxane, 1,2-dimethoxyethane, diethyleneglycoldimethyl (or diethyl, dipropyl, dibutyl)ether, triethylene glycol (or diethyl, dipropyl, dibutyl)ether, and tetraethyleneglycoldimethyl (or diethyl, dipropyl, dibutyl)ether; ketones such as methylethylketone, methyl isobutyl ketone, cyclohexanone, and acetophenone; alcohols such as butanol, octylalcohol, ethylene glycol, glycerin, diethyleneglycolmonomethyl (or monoethyl)ether, triethylene glycolmonomethyl (or monoethyl)ether, and tetraethyleneglycolmonomethyl (or monoethyl)ether; phenols such as phenol, cresol, and xylenol; esters such as ethyl acetate, butyl acetate, ethyl cellosolve acetate, and butyl cellosolve acetate; hydrocarbons such as toluene, xylene, diethylbenzene, and cyclohexane; halogenated hydrocarbons such as trichloroethane, tettachloroethane, and monochlorobenzene, etc. can be used. These organic solvents are used singly or in mixtures. In view of solubility, low hygroscopicity, low-temperature curing, environment safety, etc., it is preferable to use lactones, ethers, ketones, etc.

The reaction temperature is 80° C. or less, preferably 0 to 50° C. The reaction solution is gradually increased in viscosity as the reaction proceeds. In this case, a polyamic acid is produced which is a precursor of a polyimide resin. This polyamic acid may be partially imidized, and this imidization is also included in the precursor of the polyimide resin.

The polyimide resin is obtained by dehydrative cyclization of the above reactant (polyamic acid). The dehydrative cyclization can be carried out by a method of applying a heat treatment at 120° C. to 250° C. (thermal imidization) or a method of using a dehydrating agent (chemical imidization). In the case of the method of applying a heat treatment at 120° C. to 250° C., the method is preferably carried out while removing water produced by a dehydration reaction to the outside of the system. In this case, azeotropic removal of the water may be carried out with the use of benzene, toluene, xylene, or the like.

In the method of carrying out dehydrative cyclization with the use of a dehydrating agent, it is preferable to use, as the a dehydrating agent, acid anhydrides such as acetic anhydride, propionic anhydride, and benzoic anhydride, carbodiimide compounds such as dicyclohexylcarbodiimide, etc. In this case, dehydration catalysts such as pyridine, isoquinoline, trimethylamine, and aminopyridineimidazol may be used, if necessary. The dehydrating agent or dehydration catalyst is each preferably used in the range of 1 to 8 mol with respect to 1 mol of the aromatic tetracarboxylic dianhydride.

The polyamideimide resin or precursor thereof can be produced with the use of a trivalent tricarboxylic acid anhydride or a derivative thereof such as a trimellitic anhydride or a trimellitic anhydride derivative (a chloride of a trimellitic anhydride, etc), in place of the aromatic tetracarboxylic dianhydride in the production of the polyimide resin or precursor thereof. In addition, the polyamideimide resin or precursor thereof can be also produced with the use of a diisocyanate compound in which the residue except an amino group corresponds to the diamine compound, in place of the aromatic diamine compound and other diamine compounds. Examples of diisocyanate compounds which can be used include compounds obtained by reacting the above aromatic diamine compounds or other diamine compounds with phosgene or thionyl chloride.

The polyamide resin can be produced by reacting an aromatic dicarboxylic acid such as terephthalic acid, isophthalic acid, and phthalic acid, or a derivative thereof such as a dichloride or an acid anhydride with the aromatic diamine compound or other diamine compound.

Examples of the heat resistant resin having an ester linkage include, for example, polyester resins. Examples of the polyester resins include resins obtained by reacting an aromatic dicarboxylic acid such as terephthalic acid, isophthalic acid, and phthalic acid, or a derivative thereof such as a dichloride or an acid anhydride with an aromatic diol compound such as 1,4-dihydroxybenzene, bisphenol F, bisphenol A, and 4,4'-dihydroxybiphenyl.

As the polyamideimide resin, a polyamideimide resin is preferably used which is obtained by reacting the aromatic tetracarboxylic dianhydride with an aromatic diamine compound containing isophthalic dihydrazide as an essential constituent. As the aromatic tetracarboxylic dianhydride and the aromatic diamine compound, the compounds mentioned above are used. The molar ratio of the isophthalic dihydrazide in the aromatic diamine compound is preferably adjusted to 1 to 100 mol %. In the case of less than 1 mol %, there is a tendency to decrease the dissolution resistance to the modified polyamideimide resin, whereas the higher content of the isophthalic dihydrazide tends to decrease the moisture resistance of a layer formed from the thermosetting resin composition according to the present invention, and thus, the molar ratio is more preferably 10 to 80 mol %, and a molar ratio of 20 to 70 mol % is particularly preferably used. This polyamideimide resin can be obtained by adopting the blending ratio between the aromatic tetracarboxylic dianhydride and the aromatic diamine compound, the organic solvent used, the synthesis method, etc. in the same way as in the synthesis of the polyimide resin as described above.

The polyamideimide resin obtained by reacting a trimellitic anhydride, and a dicarboxylic acid, if necessary, and a polyisocyanate is made likely by heating to be insoluble in organic solvents, and organic fine particles can also be used which are composed of this polyamideimide resin. As for the method for producing this polyamideimide resin, the polyamideimide resin can be produced in the same way as the method for producing the above mentioned polyamideimide resin.

Examples of the method for producing fine particles include, for example, non-aqueous dispersion polymerization methods (Japanese Patent Application Laid-Open Publication No. Sho-60-48531, Japanese Patent Application Laid-Open Publication No. Sho-59-230018), precipitation polymerization methods (Japanese Patent Application Laid-Open Publication No. Sho-59-108030, Japanese Patent Application Laid-Open Publication No. Sho-60-221425), a method of mechanically milling powder modified from a resin solution, a method of carrying out microparticulation under high shear while adding a resin solution to a poor catalyst, a method of drying a sprayed solution from a resin solution to obtain fine particles, and a method of precipitation and microparticulation of, in a detergent or a resin solution, a resin which has temperature dependency of solubility in a solvent.

For the inorganic fine particles and/or organic fine particles blended in the thermosetting resin composition, fine particles are preferably used which have particle sizes with an average particle size of 50 µm or less, and a maximum particle size of 100 µm or less. The average particle size greater than 50 µm makes it less likely that a paste is obtained which has a thixotropy Index of 1.1 or more, while the maximum particle size greater than 100 µm tends to provide a coating film with an insufficient appearance, and provide insufficient adhesion. The average particle size is more preferably 30 µm or less, even more preferably 10 µm or less, and particularly preferably 3 µm or less, while the maximum particle size is more preferably 80 µm or less, even more preferably 60 µm or less, and particularly preferably 40 µm or less. The particle sizes preferably have smaller lower limits.

The thermosetting resin composition may contain an organic solvent which dissolves the polyurethane resin. Examples of this organic solvent include a polar solvent containing no nitrogen. Examples of the polar solvent containing no nitrogen include, ether type solvents such as, for example, diethylene glycol dimethyl ether, diethylene glycol diethyl ether, triethylene glycol dimethyl ether, and triethylene glycol diethyl ether; sulfur-containing solvents such as, for example, dimethyl sulfoxide, diethyl sulfoxide, dimethyl sulfone, and sulfolane; ester type solvents such as, for example, γ-butyrolactone, cellosolve acetate, butyl carbitol acetate, and 2-butoxyethyl acetate; ketone type solvents such as, for example, cyclohexanone and methylethylketone; and aromatic hydrocarbon type solvents such as, for example, toluene and xylene. These can be used singly or in combinations of two or more. The polyurethane resin differs in solubility depending on the composition thereof, and a solvent which is able to dissolve the resin is thus selected and used.

Among the organic solvents mentioned above, γ-butyrolactone is preferable from the standpoint of, in particular, printing properties such as defoaming properties and leveling properties, and the suppression of outflow (bleeding) of resist or solvents between wirings.

As the method for dispersing inorganic and/or organic fine particles in the resin solution, which may be any method for achieving sufficient dispersion, typically, kneading with a roll, mixing with a mixer etc, are applied which is carried out in the field of coating.

In order to improve the workability in coating and film properties before and after the film formation, surfactants such as an antifoaming agent and a leveling agent, coloring agents such as a dye and a pigment, a thermal stabilizer, an antioxidant, a flame retardant, and a lubricating agent can be also added to the thermosetting resin composition.

The thermosetting resin composition preferably has a viscosity of 20 Pa·s to 80 Pa·s, more preferably 30 Pa·s to 50 Pa·s at 25° C., which is measured by a rotational viscometer. The viscosity less than 20 Pa·s tends to increase outflow of the resin composition after printing, and reduce the film thickness thereof, whereas the viscosity greater than 80 Pa·s tends to decrease the transferability of the resin composition onto a base material, and increase voids and pinholes in the printed film.

The thermosetting resin composition according to the present embodiment can be used preferably for forming a protective film for a wiring pattern of a flexible wiring board, by the method including a step of printing the thermosetting resin composition on the wiring pattern of the flexible wiring board, and a step of curing the printed thermosetting resin composition to form a cured film as a protective film. The flexible wiring board including the protective film formed with the use of the thermosetting resin composition according to the present embodiment has excellent electrical properties, and moreover has a base material which is excellent in flexibility with sufficiently small warpage. Therefore, the flexible wiring board can be excellent in terms of reliability. The thermosetting resin composition according to the present embodiment is suitable particularly for the formation of a protective film on the surface of a flexible wiring board with a wiring pattern partially or entirely including a plated layer formed in advance by plating processing. Examples of the plating processing include, for example, tin, nickel or gold plating.

The condition for thermal curing is, from the standpoint of preventing diffusion of the plated layer into copper wiring, and achieving a warpage behavior and flexibility preferred as a protective film, preferably 80° C. to 130° C., and particularly preferably 90° C. to 120° C., but not limited to this range, and the curing can be carried out, for example, in the range of 50 to 200° C., above all, 50 to 140° C. The heating time is, from the standpoint of preventing diffusion of the plated layer into copper wiring, and achieving a warpage behavior and flexibility preferred as a protective film, 60 to 150 minutes, preferably 80 to 120 minutes, but not limited to this range, and the curing can be carried out in the range of 1 to 1000 minutes, for example, 5 to 300 minutes, above all, 10 to 150 minutes.

When the thermosetting resin composition according to the present embodiment is heated at 120° C. for 60 minutes to form a cured film with a film thickness of 30 μm, the cured film preferably has a tensile elasticity of 100 MPa to 4000 MPa at 25° C. This tensile elasticity can make the cured film as a protective film have preferred electrical properties and flexibility. From the same point of view, the tensile elasticity is more preferably 200 MPa to 3500 MPa, 400 MPa to 3000 MPa, or 600 MPa to 2500 MPa. In addition, from the standpoint of ensuring that a warpage behavior and flexibility can be achieved preferred as a protective film, the elongation percentage of the cured film at 25° C. is preferably 10% to 1000%, more preferably 100% to 500%, even more preferably 200% to 400%. While the tensile elasticity is preferably higher, there is a possibility that the protective film will have a crack caused when the tensile elasticity is greater than 4000 MPa. In addition, while the elongation percentage is also preferably higher, there is a possibility that it will be difficult to maintain the electrical properties at a high level when the elongation percentage is greater than 1000%. Furthermore, from the standpoint of ensuring that electrical properties can be achieved which are preferred as a protective film, the water absorption rate of the cured film at 25° C. is preferably 0 or more and less than 1.5%, and more preferably 0 or more and less than 1.0%.

FIG. 1 is a plan view illustrating an embodiment of a flexible wiring board. The flexible wiring board 100 shown in FIG. 1 includes a base material 3, a wiring pattern 5 provided on the base material 3, and a protective film 7 covering the wiring pattern 5. The protective film 7 is a cured film formed by curing the thermosetting resin composition described above.

Examples of the base material 3 include a polyimide film and a polyimide film with an epoxy adhesive layer. The thickness of the base material 3 is preferably 10 to 200 μm.

The wiring pattern 5 preferably has, on the surface thereof, a plating layer formed by plating processing. Examples of the plating processing include Sn plating, nickel plating, and gold plating. The wiring width of the wiring pattern 5 is preferably 5 to 100 μm. The wiring interval of the wiring pattern 5 is preferably 5 to 100 μm.

The flexible wiring board 100 can be produced by a method including a step of providing the wiring pattern 3 on the base material 3, a step of subjecting the wiring pattern 3 to Sn plating processing, a step of printing the thermosetting resin composition so as to cover at least a portion of the wiring pattern 3 subjected to the Sn plating processing, and a step of curing the printed thermosetting resin composition to form the protective film 7. The printing of the thermosetting resin composition is preferably carried out by screen printing.

The thermosetting resin composition according to the present embodiment can be also applied to a protective film for a rigid substrate which has a base material with a thickness greater than 200 μm.

The thermosetting resin composition according to the present embodiment is used preferably as a film forming material for various types of electrical products and electronic components, according to an application method such as screen printing, a dispenser, or spin coating. In particular, the application by screen printing is preferred.

The thermosetting resin composition according to the present embodiment is preferably used as a material for forming, for example, overcoat materials, liquid sealing materials, interlayer insulating films, surface protective films, solder resist layers, adhesive layers, etc. for electronic components in the fields of semiconductor elements, printed boards, etc. In addition, the thermosetting resin composition can be also used for varnish for enamel wires, impregnated varnish for electrical insulation, cast varnish, varnish for sheets, in combination with a base material such as mica or glass cloth, varnish for MCL laminated plate, varnish for friction materials, etc. In addition, the thermosetting resin composition according to the present embodiment can prevent a resin-coated film from being peeled from a circuit board or the like, and achieve an electronic component with high reliability, because the thermosetting resin composition according to the present embodiment is excellent in terms of the adhesion to the base material and printing workability.

EXAMPLES

The present invention will be further specifically described below with reference to examples. However, the present invention is not to be considered limited to these examples.

1. Synthesis of Polyurethane Resin

Synthesis Example 1

Polycarbonatediol (UM-CARB90(3/1), from Ube Industries, Ltd., Average Molecular Weight: approximately 900) represented by the above chemical formula (1B) was prepared which included, as $R^2$, a constitutional unit derived from 1,4-cyclohexanedimethanol and a constitutional unit derived from 1,6-hexanediol at a molar ratio of 3:1, with n in the range of 4 to 6 on average. In a reaction container equipped with a stirring device, a thermometer, and a condenser, 156.98 g (0.175 mol) of the above polycarbonatediol, 91.70 g (0.350 mol) of Desmodur-W (from Sumitomo Bayer Urethane Co., Ltd.) as 4,4-dicyclohexylmethanediisocyanate, and 165.80 g of γ-butyrolactone (from Mitsubishi Chemical Corporation) as a solvent were put, to dissolve all of the raw materials at 150° C. and react the materials for 4 hours, and thereby produce a polyisocyanate having an urethane linkage.

Then, the temperature of the reaction solution was lowered down to 80° C., and with the addition of 45.85 g (0.175 mol) of Desmodur-W, 33.60 g (0.175 mol) of trimellitic anhydride (from Mitsubishi Gas Chemical Company, Inc.), and 162.33 g of γ-butyrolactone (from Mitsubishi Chemical Corporation), the temperature was increased up to 150° C. to dissolve all of the raw materials and react the materials for 3 hours.

The temperature of the reaction solution was lowered down to 80° C., and with the addition of 16.40 g (0.158 mol) of neopentyl glycol (from Kanto Chemical Co., Inc.) as a diol, the temperature was increased up to 120° C. to dissolve all of the raw materials, and react the materials for 4 hours. Then, the temperature of the reaction solution was lowered down to 80° C., and with the addition of 9.67 g (0.105 mol) of glycerin (Kanto Chemical Co., Inc.) as a triol and 26.07 g of γ-butyrolactone (from Mitsubishi Chemical Corporation), the temperature was increased up to 110° C. to progress a reaction. The reaction was developed while confirming, by IR measurement, the presence of isocyanate groups in the reaction solution, and considered to be terminated at the point when no isocyanate group was confirmed in the system. The reaction time was 11.5 hours.

The above reaction produced a polyurethane resin having a hydroxyl group and an imide linkage. The obtained polyurethane resin was 8000 in number average molecular weight, 4.36 in the degree of dispersion, and 27 mgKOH/g in acid value and 16 mgKOH/g in hydroxyl value of solid content.

Synthesis Example 2

Polycarbonatediol (UM-CARB90(1/1), from Ube Industries, Ltd., Average Molecular Weight: approximately 900) represented by the above chemical formula (1B) was prepared which included, as $R^2$, a constitutional unit derived from 1,4-cyclohexanedimethanol and a constitutional unit derived from 1,6-hexanediol at a molar ratio of 1:1, with n in the range of 4 to 6 on average. In a reaction container equipped with a stirring device, a thermometer, and a condenser, 158.12 g (0.175 mol) of the above polycarbonatediol, 91.70 g (0.350 mol) of Desmodur-W, and 166.55 g of γ-butyrolactone were put, to dissolve all of the raw materials at 150° C. and react the materials for 4 hours, and thereby produce a polyisocyanate having an urethane linkage.

Then, the temperature of the reaction solution was lowered down to 80° C., and with the addition of 45.85 g (0.175 mol) of Desmodur-W, 33.60 g (0.175 mol) of trimellitic anhydride, and 162.72 g of γ-butyrolactone, all of the raw materials were dissolved at 150° C. and reacted for 3 hours. The temperature of the reaction solution was lowered down to 80° C., and with the addition of 16.40 g (0.158 mol) of neopentyl glycol, all of the raw materials were dissolved at 120° C. and reacted for 4 hours. Then, the temperature of the reaction solution was lowered down to 80° C., and with the addition of 9.67 g (0.105 mol) of glycerin and 26.07 g of γ-butyrolactone, a reaction was developed at 110° C. The reaction was developed while confirming, by IR measurement, the presence of isocyanate groups in the reaction solution, and considered to be terminated at the point when no isocyanate group was confirmed in the system. The reaction time was 12 hours.

The above reaction produced a polyurethane resin having a hydroxyl group and an imide linkage. The obtained polyurethane resin was 8400 in number average molecular weight, 4.54 in the degree of dispersion, and 27 mgKOH/g in acid value and 16 mgKOH/g in hydroxyl value of solid content.

Synthesis Example 3

Polycarbonatediol (UM-CARB90(1/3), from Ube Industries, Ltd., Average Molecular Weight: approximately 900) represented by the above chemical formula (1B) was prepared which included, as $R^2$, a constitutional unit derived from 1,4-cyclohexanedimethanol and a constitutional unit derived from 1,6-hexanediol at a molar ratio of 1:3, with n in the range of 4 to 6 on average. In a reaction container equipped with a stirring device, a thermometer, and a condenser, 156.48 g (0.175 mol) of the above polycarbonatediol, 91.70 g (0.350 mol) of Desmodur-W, and 166.55 g of γ-butyrolactone were put to dissolve all of the raw materials at 150° C. and react the materials for 4 hours.

Then, the temperature of the reaction solution was lowered down to 80° C., and with the addition of 45.85 g (0.175 mol) of Desmodur-W, 33.60 g (0.175 mol) of trimellitic anhydride (from Mitsubishi Gas Chemical Company, Inc.), and 161.08 g of γ-butyrolactone, all of the raw materials were dissolved at 150° C. and reacted for 3 hours to produce a polyisocyanate having an urethane linkage.

The temperature of the reaction solution was lowered down to 80° C., and with the addition of 16.40 g (0.158 mol) of neopentyl glycol, all of the raw materials were dissolved at 120° C. and reacted for 4 hours. Then, the temperature of the reaction solution was lowered down to 80° C., and with the addition of 9.67 g (0.105 mol) of glycerin (from Kanto Chemical Co., Inc.) and 26.07 g of γ-butyrolactone, a reaction was developed at 110° C. The reaction was developed while confirming, by IR measurement, the presence of isocyanate groups in the reaction solution, and considered to be terminated at the point when no isocyanate group was confirmed in the system. The reaction time was 14 hours.

The above reaction produced a polyurethane resin having a hydroxyl group and an imide linkage. The obtained polyurethane resin was 8000 in number average molecular weight, 4.23 in the degree of dispersion, and 28 mgKOH/g in acid value and 17 mgKOH/g in hydroxyl value of solid content.

Synthesis Example 4

Prepared were the UM-GARB 90 (1/1) and PCDL T-6001 (from Asahi Kasei Chemicals Corporation) represented by the above formula (2), which was a polycarbonatediol in which R was a constitutional unit derived from 1,6-hexanediol with m in the range of 9.5 to 11.5 on average. To a reaction container equipped with a stirring device, a thermometer, and a condenser, 79.06 g (0.088 mol) of UM-CARB90 (1/1) and 85.53 g (0.088 mol) of PCDL T-6001, 91.70 g (0.350 mol) of Desmodur-W, and 170.86 g of γ-butyrolactone were added, to dissolve all of the raw materials at 150° C. and react the materials for 4 hours, and thereby produce a polyisocyanate having an urethane linkage.

Then, the temperature of the reaction solution was lowered down to 80° C., and with the addition of 45.85 g (0.175 mol) of Desmodur-W, 33.60 g (0.175 mol) of trimellitic anhydride, and 164.88 g of γ-butyrolactone, all of the raw materials were dissolved at 150° C. and reacted for 3 hours.

The temperature of the reaction solution was lowered down to 80° C., and with the addition of 16.40 g (0.158 mol) of neopentyl glycol, the temperature was increased up to 120° C. to dissolve all of the raw materials and react the materials for 4 hours. Then, the temperature of the reaction solution was lowered down to 80° C., and with the addition of 9.67 g (0.105 mol) of glycerin and 26.07 g of γ-butyrolactone, the temperature was increased up to 110° C. to develop a reaction. The reaction was developed while confirming, by IR measurement, the presence of isocyanate groups in the reaction solution, and considered to be terminated at the point when no isocyanate group was confirmed in the system. The reaction time was 11.5 hours.

The above reaction produced a polyurethane resin having a hydroxyl group and an imide linkage. The obtained polyurethane resin was 9000 in number average molecular weight, 5.42 in the degree of dispersion, and 27 mgKOH/g in acid value and 16 mgKOH/g in hydroxyl value of solid content.

Synthesis Example 5

Prepared were the UM-CARB90 (1/1) and PCDL T-6002 (from Asahi Kasei Chemicals Corporation) represented by the above formula (2), which was a polycarbonatediol in which R was a constitutional unit derived from 1,6-hexanediol with m in the range of 21.5 to 23.5 on average. To a reaction container equipped with a stirring device, a thermometer, and a condenser, 67.77 g (0.075 mol) of UM-CARB90 (1/1) and 148.96 g (0.075 mol) of PCDL T-6002, 78.60 g (0.30 mol) of Desmodur-W, and 196.89 g of γ-butyrolactone were added, to dissolve all of the raw materials at 150° C. and react the materials for 4 hours, and thereby produce a polyisocyanate having an urethane linkage.

Then, the temperature of the reaction solution was lowered down to 80° C., and with the addition of 39.30 g (0.15 mol) of Desmodur-W, 28.80 g (0.15 mol) of trimellitic anhydride, and 166.54 g of γ-butyrolactone, all of the raw materials were dissolved at 150° C. and reacted for 3 hours.

The temperature of the reaction solution was lowered down to 80° C., and with the addition of 14.06 g (0.135 mol) of neopentyl glycol, the temperature was increased up to 120° C. to dissolve all of the raw materials and react the materials for 4 hours. Then, the temperature of the reaction solution was lowered down to 80° C., and with the addition of 8.29 g (0.09 mol) of glycerin and 22.35 g of γ-butyrolactone, the temperature was increased up to 110° C. to develop a reaction. The reaction was developed while confirming, by IR measurement, the presence of isocyanate groups in the reaction solution, and considered to be terminated at the point when no isocyanate group was confirmed in the system. The reaction time was 10 hours.

The above reaction produced a polyurethane resin having a hydroxyl group and an imide linkage. The obtained polyurethane resin was 9600 in number average molecular weight, 6.18 in the degree of dispersion, and 22 mgKOH/g in acid value and 13 mgKOH/g in hydroxyl value of solid content.

Synthesis Example 6

In a reaction container equipped with a stirring device, a thermometer, and a condenser, 91.52 g (0.10 mol) of UM-CARB90 (3/1) and 99.51 g (0.05 mol) of PCDL T-6002, 78.60 g (0.30 mol) of Desmodur-W, and 179.75 g of γ-butyrolactone were put to dissolve all of the raw materials at 150° C. and react the materials for 4 hours, and thereby produce a polyisocyanate having an urethane linkage.

Then, the temperature of the reaction solution was lowered down to 80° C., and with the addition of 39.30 g (0.15 mol) of Desmodur-W, 28.80 g (0.15 mol) of trimellitic anhydride, and 157.87 g of γ-butyrolactone, all of the raw materials were dissolved at 150° C. and reacted for 3 hours.

The temperature of the reaction solution was lowered down to 80° C., and with the addition of 14.06 g (0.135 mol) of neopentyl glycol, the temperature was increased up to 120° C. to dissolve all of the raw materials and react the materials for 4 hours. Then, the temperature of the reaction solution was lowered down to 80° C., and with the addition of 8.29 g (0.09 mol) of glycerin and 22.35 g of γ-butyrolactone, the temperature was increased up to 110° C. to develop a reaction. The reaction was developed while confirming, by IR measurement, the presence of isocyanate groups in the reaction solution, and considered to be terminated at the point when no isocyanate group was confirmed in the system. The reaction time was 18 hours.

The above reaction produced a polyurethane resin having a hydroxyl group and an imide linkage. The obtained polyurethane resin was 8500 in number average molecular weight, 4.99 in the degree of dispersion, and 23 mgKOH/g in acid value and 14 mgKOH/g in hydroxyl value of solid content.

Synthesis Example 7

In a reaction container equipped with a stirring device, a thermometer, and a condenser, 91.37 g (0.10 mol) of UM-CARB90 (1/1) and 99.51 g (0.05 mol) of PCDL T-6002, 78.60 g (0.30 mol) of Desmodur-W, and 179.65 g of γ-butyrolactone were put to dissolve all of the raw materials at 150° C. and react the materials for 4 hours, and thereby produce a polyisocyanate having an urethane linkage.

Then, the temperature of the reaction solution was lowered down to 80° C., and with the addition of 39.30 g (0.15 mol) of Desmodur-W, 28.80 g (0.15 mol) of trimellitic anhydride, and 157.93 g of γ-butyrolactone, the temperature was increased up to 150° C. to dissolve all of the raw materials and react the materials for 3 hours.

The temperature of the reaction solution was lowered down to 80° C., and with the addition of 14.06 g (0.135 mol) of neopentyl glycol, the temperature was increased up to 120° C. to dissolve all of the raw materials and react the materials for 4 hours. Then, the temperature of the reaction solution was lowered down to 80° C., and with the addition of 8.29 g (0.09 mol) of glycerin and 22.35 g of γ-butyrolactone, the temperature was increased up to 110° C. to develop a reaction. The reaction was developed while confirming, by IR measurement, the presence of isocyanate groups in the reaction solution, and considered to be terminated at the point when no isocyanate group was confirmed in the system. The reaction time was 18 hours.

The above reaction produced a polyurethane resin having a hydroxyl group and an imide linkage. The obtained polyurethane resin was 8800 in number average molecular weight, 5.19 in the degree of dispersion, and 23 mgKOH/g in acid value and 14 mgKOH/g in hydroxyl value of solid content.

Synthesis Example 8

In a reaction container equipped with a stirring device, a thermometer, and a condenser, 161.44 g (0.179 mol) of UM-CARB90 (1/1) was put, and with the addition of 53.65 g (0.214 mol) of MILLIONATE MT (from Nippon Polyurethane Industry Co., Ltd.) as 4,4'-diphenylmethane diisocyanate, 24.89 g (0.143 mol) of Cosmonate T-80 (from Mitsui Chemicals Polyurethanes, Inc.) as a mixture of 2,4-tolylenediisocyanate and 2,6-tolylenediisocyanate at a mass ratio of 80:20, and 159.93 g of γ-butyrolactone, all of the raw materials were dissolved at 150° C., and reacted for 4 hours to produce a polyisocyanate having an urethane linkage.

Then, the temperature of the reaction solution was lowered down to 60° C., 63.71 g (0.332 mol) of trimellitic anhydride was added and dissolved completely, and then, with the addition of 23.00 g (0.092 mol) of MILLIONATE MT, 10.67 g (0.061 mol) of Cosmonate T-80, and 342.98 g of γ-butyrolactone, the temperature was increased up to 120° C. to dissolve all of the raw materials and react the materials for 1 hour.

Then, the temperature of the reaction solution was increased up to 180° C. to develop a reaction at 180° C. for 2 hours. Subsequently, the temperature of the reaction solution was lowered down to 120° C., and 5.61 g of 2-butanone oxime (from Wako Pure Chemical Industries, Ltd) was added to terminate the reaction.

The obtained polyurethane resin having an amide linkage and an imide linkage was 9200 in number average molecular weight, 3.09 in the degree of dispersion, and 31 mgKOH/g in acid value of solid content.

Synthesis Example 9

Prepared were the UM-CARB90 (1/1) and PLACCEL CD-220 (from Daicel Chemical Industries, Ltd.) represented by the above formula (2), which was a polycarbonatediol in which R was a constitutional unit derived from 1,6-hexanediol with m in the range of 21.5 to 23.5 on average. In a reaction container equipped with a stirring device, a thermometer, and a condenser, 71.79 g (0.079 mol) of UM-CARB90 (1/1) and 158.34 g (0.079 mol) of PLACCEL CD-220 were put, and with the addition of 47.72 g (0.190 mol) of MILLIONATE MT, 22.14 g (0.127 mol) of Cosmonate T-80, and 200.00 g of γ-butyrolactone, all of the raw materials were dissolved at 150° C., and reacted for 4 hours to produce a polyisocyanate having an urethane linkage.

Then, the temperature of the reaction solution was lowered down to 60° C., 56.66 g (0.295 mol) of trimellitic anhydride was added and dissolved completely, and then, with the addition of 20.45 g (0.082 mol) of MILLIONATE MT, 9.49 g (0.055 mol) of Cosmonate T-80, and 191.58 g of γ-butyrolactone, all of the raw materials were dissolved at 120° C., and reacted for 1 hour.

Then, the temperature of the reaction solution was increased up to 180° C. to develop a reaction at 180° C. for 2 hours. Subsequently, the temperature of the reaction solution was lowered down to 120° C., and 4.99 g of 2-butanone oxime was added to terminate the reaction.

The obtained polyurethane resin having an amide linkage and an imide linkage was 8700 in number average molecular weight, 3.09 in the degree of dispersion, and 26 mgKOH/g in acid value of solid content.

Synthesis Example 10

In a reaction container equipped with a stirring device, a thermometer, and a condenser, 158.12 g (0.175 mol) of UM-CARB90 (1/1) and 348.76 g (0.175 mol) of PLACCEL CD-220 were put, and with the addition of 105.11 g (0.60 mol) of MILLIONATE MT, 48.76 g (0.28 mol) of Cosmonate T-80, and 440.50 g of γ-butyrolactone, all of the raw materials were dissolved at 150° C., and reacted for 4 hours to produce a polyisocyanate having an urethane linkage.

Then, the temperature of the reaction solution was lowered down to 60° C., 124.80 g (0.65 mol) of trimellitic anhydride was added and dissolved completely, and then, with the addition of 45.05 g (0.18 mol) of MILLIONATE MT, 20.90 g (0.12 mol) of Cosmonate T-80, and 421.99 g of γ-butyrolactone, the temperature was increased up to 120° C. to dissolve all of the raw materials, and react the materials for 1 hour.

The temperature of the reaction solution was increased up to 180° C. to develop a reaction at 180° C. for 3 hours, at 150° C. for 0.5 hours, and at 130° C. for 0.5 hours. Subsequently, 10.99 g of 2-butanone oxime was added at 120° C. to terminate the reaction.

The obtained polyurethane resin having an amide linkage and an imide linkage was 13900 in number average molecular weight, 3.29 in the degree of dispersion, and 19 mgKOH/g in acid value of solid content.

Synthesis Example 11

In a reaction container equipped with a stirring device, a thermometer, and a condenser, 121.47 g (0.133 mol) of UM-CARB90 (1/1) and 132.91 g (0.067 mol) of PLACCEL CD-220 were put, and with the addition of 59.91 g (0.239 mol) of MILLIONATE MT, 27.80 g (0.160 mol) of Cosmonate T-80, and 228.06 g of γ-butyrolactone, all of the raw materials were dissolved at 150° C., and reacted for 4 hours to produce a polyisocyanate having an urethane linkage.

Then, the temperature of the reaction solution was lowered down to 60° C., 71.14 g (0.371 mol) of trimellitic anhydride was added and dissolved completely, and then, with the addition of 25.68 g (0.103 mol) of MILLIONATE MT, 11.91 g (0.068 mol) of Cosmonate T-80, and 229.01 g of γ-butyrolactone, the temperature was increased up to 120° C. to dissolve all of the raw materials, and react the materials for 1 hour.

The temperature of the reaction solution was increased up to 180° C. to develop a reaction at 180° C. for 2.5 hours, at 150° C. for 1 hour, and at 120° C. for 1 hour. Subsequently, 10.99 g of 2-butanone oxime was added at 120° C. to terminate the reaction.

The obtained polyurethane resin having an amide linkage and an imide linkage was 13100 in number average molecular weight, 3.30 in the degree of dispersion, and 20 mgKOH/g in acid value of solid content.

Synthesis Example 12

In a reaction container equipped with a stirring device, a thermometer, and a condenser, 88.03 g (0.096 mol) of UM-CARB90 (1/1) and 191.17 g (0.096 mol) of PCDL T-6002 were put, and with the addition of 57.81 g (0.231 mol) of MILLIONATE MT, 26.82 g (0.154 mol) of Cosmonate T-80, and 242.56 g of γ-butyrolactone, all of the raw materials were dissolved at 150° C., and reacted for 4 hours to produce a polyisocyanate having an urethane linkage.

Then, the temperature of the reaction solution was lowered down to 60° C., 68.64 g (0.378 mol) of trimellitic anhydride was added and dissolved completely, and then, with the addition of 24.78 g (0.099 mol) of MILLIONATE MT, 11.50 g (0.066 mol) of Cosmonate T-80, and 232.23 g of γ-butyrolactone, the temperature was increased up to 120° C. to dissolve all of the raw materials, and react the materials for 1 hour.

The temperature of the reaction solution was increased up to 180° C. to develop a reaction at 180° C. for 3.5 hours, at 150° C. for 0.5 hours, and at 120° C. for 0.5 hours. Subsequently, 6.05 g of 2-butanone oxime (from Wako Pure Chemical Industries, Ltd.) was added at 120° C. to terminate the reaction.

The obtained polyurethane resin having an amide linkage and an imide linkage was 12600 in number average molecular weight, 3.73 in the degree of dispersion, and 21 mgKOH/g in acid value of solid content.

Synthesis Example 13

In a reaction container equipped with a stirring device, a thermometer, and a condenser, 30.93 g (0.215 mol) of cyclohexanedimethanol (from Eastman Co., Ltd.), 30.21 g (0.031 mol) of PCDL T-6001, and 69.72 g (0.035 mol) of PCDL T-6002 were put, and with the addition of 84.24 g (0.337 mol) of MILLIONATE MT, 39.08 g (0.224 mol) of Cosmonate T-80, and 169.45 g of γ-butyrolactone, all of the raw materials were dissolved at 150° C., and reacted for 4 hours to produce a polyisocyanate having an urethane linkage.

Then, the temperature of the reaction solution was lowered down to 60° C., 71.14 g (0.371 mol) of trimellitic anhydride was added and dissolved completely, and then, with the addition of 13.51 g (0.054 mol) of MILLIONATE MT, 6.27 g (0.036 mol) of Cosmonate T-80, and 182.80 g of γ-butyrolactone, the temperature was increased up to 120° C. to dissolve all of the raw materials, and react the materials for 1 hour.

The temperature of the reaction solution was increased up to 180° C. to develop a reaction at 180° C. for 3 hours and at 120° C. for 0.5 hours. Subsequently, 7.16 g of 2-butanone oxime was added at 120° C. to terminate the reaction.

The obtained polyurethane resin having an amide linkage and an imide linkage was 10600 in number average molecular weight, 2.57 in the degree of dispersion, and 28 mgKOH/g in acid value of solid content.

Synthesis Example 14

In a reaction container equipped with a stirring device, a thermometer, and a condenser, 128.03 (0.140 mol) of UM-CARB90 (1/1) and 141.28 g (0.070 mol) of PLACCEL CD-220 were put. With the addition of 52.55 g (0.210 mol) of MILLIONATE MT, 24.38 g (0.140) of Cosmonate T-80, and 230.83 g of γ-butyrolactone there, all of the raw materials were dissolved at 150° C., and reacted for 4 hours to produce a polyisocyanate having an urethane linkage.

Then, the temperature of the reaction solution was lowered down to 60° C., 67.25 g (0.35 mol) of trimellitic anhydride was added, and dissolved completely, and then, with the addition of 31.55 g (0.126 mol) of MILLIONATE MT, 14.63 g (0.084 mol) of Cosmonate T-80, and 235.00 g of γ-butyrolactone, the temperature was increased up to 120° C. to dissolve all of the raw materials, and progress a reaction for 1 hour. Then, the temperature of the reaction solution was increased up to 180° C. to progress the reaction at 180° C. for 3 hours, at 150° C. for 1.5 hours, and at 120° C. for 1 hour. Subsequently, 6.16 g of 2-butanone oxime was added at 120° C. to terminate the reaction.

The obtained polyurethane resin having an amide linkage and an imide linkage was 14100 in number average molecular weight, 3.20 in the degree of dispersion, and 13.3 mgKOH/g in acid value of solid content.

Synthesis Example 15

In a reaction container equipped with a stirring device, a thermometer, and a condenser, 238.88 g (0.268 mol) of UM-CARB90 (1/1), 17.71 g (0.132 mol) of 2,2-dimethylolpropionic acid (from Nippon Kasei Chemical Co., Ltd.), 110.04 g (0.420 mol) of Desmodur-W, and 370.67 g of γ-butyrolactone were put to dissolve all of the raw materials at 120° C., and react the materials for 7.5 hours. Then, the temperature was decreased down to 110° C., and 4.04 g of 2-butanone oxime was added to develop a reaction for 1 hour, and then terminate the reaction.

The obtained polyurethane resin having a carboxyl group was 13100 in number average molecular weight, 2.52 in the degree of dispersion, and 20.0 mgKOH/g in acid value of solid content.

Comparative Synthesis Example 1

In a reaction container equipped with a stirring device, a thermometer, and a condenser, 628 g of PLACCEL CD220, 400 g of PCDL T-6001, 41 g of 2,2-dimethylolpropionic acid (from Nippon Kasei Chemical Co., Ltd.), 565 g (2.16 mol) of Desmodur-W, and 1090 g of γ-butyrolactone were put to dissolve all of the raw materials at 150° C., and react the materials for 4 hours, thereby producing a polyisocyanate having an urethane linkage.

Then, the temperature of the reaction solution was lowered down to 80° C., and through a dropping funnel, 183 g (0.11 mol) of polybutadienediol having a 1,2-repeating unit (Trade Name: G-1000, from Nippon Soda Co., Ltd.) as a polymeric polyol and 656 g of γ-butyrolactone were delivered by drops for 30 minutes. After completing the dropping, a reaction was developed at 140° C. for 2 hours.

The temperature of the reaction solution was lowered down to 90° C., and through a dropping funnel, 122 g of 2,2-dimethylolpropionic acid and 194 g of γ-butyrolactone were delivered by drops for 30 minutes. After a reaction was developed at 110° C. for 6.5 hours, 20 g of 2-butanone oxime was added to terminate the reaction.

The obtained polyurethane resin having a carboxyl group was 10800 in number average molecular weight, 5.10 in the degree of dispersion, and 36.2 mgKOH/g in acid value of solid content.

Comparative Synthesis Example 2

In a reaction container equipped with a stirring device, a thermometer, and a condenser, 316.24 g of UM-CARB90 (3/1), 20.12 g (0.15 mol) of 2,2-dimethylolpropionic acid, 275.10 g (1.05 mol) of Desmodur-W, and 407.64 g of γ-butyrolactone were put to dissolve all of the raw materials at 150° C., and react the materials for 4 hours, thereby producing a polyisocyanate having an urethane linkage.

Then, the temperature of the reaction solution was lowered down to 80° C., and through a dropping funnel, 78.81 g of G-1000 as a polybutadienediol and 255.56 g of γ-butyrolactone were delivered by drops for 30 minutes. After completing the dropping, a reaction was developed at 140° C. for 2 hours.

The temperature of the reaction solution was lowered down to 90° C., and through a dropping funnel, 59.63 g (0.4445 mol) of 2,2-dimethylolpropionic acid and 96.71 g of γ-butyrolactone were delivered by drops for 30 minutes. After a reaction was developed at 110° C. for 5 hours, 10.01 g of 2-butanone oxime was added to terminate the reaction.

The obtained polyurethane resin having a carboxyl group was 10000 in number average molecular weight, 5.32 in the degree of dispersion, and 37 mgKOH/g in acid value of solid content.

Comparative Synthesis Example 3

In a reaction container equipped with a stirring device, a thermometer, and a condenser, 171.1 g (0.175 mol) of PCDL T-6001, 91.7 g (0.350 mol) of Desmodur-W, and 175.2 g of γ-butyrolactone were put to dissolve all of the raw materials at 150° C., and react the materials for 4 hours, thereby producing a polyisocyanate having an urethane linkage.

Then, the temperature of the reaction solution was lowered down to 80° C., and with the addition of 45.9 g (0.175 mol) of Desmodur-W, 33.6 g (0.175 mol) of trimellitic anhydride, and 197.2 g of γ-butyrolactone, the temperature was increased up to 150° C. to dissolve all of the raw materials, and react the materials for 3 hours.

The temperature of the reaction solution was lowered down to 80° C., and with the addition of 16.4 g (0.158 mol) of neopentyl glycol, the temperature was increased up to 120° C. to dissolve all of the raw materials, and react the materials for 4 hours. Then, the temperature of the reaction solution was lowered down to 80° C., and with the addition of 9.7 g (0.105 mol) of glycerin, a reaction was developed at 110° C. The reaction was developed while confirming, by IR measurement, the presence of isocyanate groups in the reaction solution, and considered to be terminated at the point when no isocyanate group was confirmed in the system. The reaction time was 9.5 hours.

The above reaction produced a polyurethane resin having a hydroxyl group and an imide linkage. The obtained polyurethane resin was 8400 in number average molecular weight, 5.80 in the degree of dispersion, and 27 mgKOH/g in acid value and 16 mgKOH/g in hydroxyl value of solid content.

Comparative Synthesis Example 4

In a reaction container equipped with a stirring device, a thermometer, and a condenser, 687.86 g (0.35 mol) of PLACCEL CD-220 was put, and with the addition of 105.11 g (0.60 mol) of MILLIONAIE MT, 48.76 g (0.28 mol) of Cosmonate T-80, and 561.15 g of γ-butyrolactone, all of the raw materials were dissolved at 150° C., and reacted for 4 hours to produce a polyisocyanate having an urethane linkage.

Then, the temperature of the reaction solution was lowered down to 60° C., 124.80 g (0.65 mol) of trimellitic anhydride was added and dissolved completely, and then, with the addition of 45.05 g (0.18 mol) of MILLIONATE MT, 20.90 g (0.12 mol) of Cosmonate T-80, and 482.32 g of γ-butyrolactone, the temperature was increased up to 120° C. to dissolve all of the raw materials, and react the materials for 1 hour.

The temperature of the reaction solution was increased up to 180° C. to develop a reaction at 180° C. for 4 hours, at 150° C. for 2 hours, and at 120° C. for 1 hour. Subsequently, 10.99 g of 2-butanone oxime was added at 120° C. to terminate the reaction.

The obtained polyurethane resin having an amide linkage and an imide linkage was 13500 in number average molecular weight, 2.97 in the degree of dispersion, and 18 mgKOH/g in acid value of solid content.

Comparative Synthesis Example 5

In a reaction container equipped with a stirring device, a thermometer, and a condenser, 171.58 g (0.193 mol) of UM-CARB90 (1/1), 11.07 g (0.083 mol) of 2,2-dimethylolpropionic acid (from Nippon Kasei Chemical Co., Ltd.), 151.31 g (0.578 mol) of Desmodur-W, and 222.64 g of γ-butyrolactone were put to dissolve all of the raw materials at 150° C., and react the materials for 4 hours, and the temperature was decreased down to 70° C. Then, 36.89 g (0.909 mol) of 2,2-dimethylolpropionic acid and 153.76 g of γ-butyrolactone were added to the reaction container at 70° C. to develop a reaction at 120° C. for 2.5 hours. Then, the temperature was decreased down to 110° C., and 5.55 g of 2-butanone oxime was added to develop a reaction for 1 hour, and then terminate the reaction.

The obtained polyurethane resin having a carboxyl group was 9800 in number average molecular weight, 3.45 in the degree of dispersion, and 53.3 mgKOH/g in acid value of solid content.

Comparative Synthesis Example 6

In a reaction container equipped with a stirring device, a thermometer, and a condenser, 418.93 g (0.470 mol) of UM-CARB90 (1/1), 4.02 g (0.030 mol) of 2,2-dimethylolpropionic acid (from Nippon Kasei Chemical Co., Ltd.), 137.55 g (0.525 mol) of Desmodur-W, and 565.55 g of γ-butyrolactone were put to dissolve all of the raw materials at 120° C., and react the materials for 9.5 hours. Then, the temperature was decreased down to 110° C., and 5.05 g of 2-butanone oxime was added to develop a reaction for 1 hour, and then terminate the reaction.

The obtained polyurethane resin having a carboxyl group was 12600 in number average molecular weight, 2.48 in the degree of dispersion, and 3.0 mgKOH/g in acid value of solid content.

Comparative Synthesis Example 7

In a reaction container equipped with a stirring device, a thermometer, and a condenser, 225.89 g (0.25 mol) of UM-CARB90 (1/1), 131.00 g (0.50 mol) of Desmodur-W, and 292.00 g of γ-butyrolactone were put to dissolve all of the raw materials at 150° C., and react the materials for 4 hours, thereby producing a polyisocyanate having an urethane group.

Then, the temperature of the reaction solution was lowered down to 80° C., and with the addition of 13.10 g (0.05 mol) of Desmodur-W, 9.60 g (0.05 mol) of trimellitic anhydride, and 87.59 g of γ-butyrolactone, all of the raw materials were dissolved at 150° C., and reacted for 3 hours.

The temperature of the reaction solution was lowered down to 80° C., and with the addition of 34.37 g (0.33 mol) of neopentyl glycol, all of the raw materials were dissolved at 120° C., and reacted for 4 hours. Then, the temperature of the reaction solution was lowered down to 80° C., and with the addition of 20.26 g (0.22 mol) of glycerin and 54.63 g of γ-butyrolactone, a reaction was developed at 110° C. The reaction was developed while confirming, by IR measurement, the presence of isocyanate groups in the reaction solution, and considered to be terminated at the point when no isocyanate group was confirmed in the system. The reaction time was 8 hours.

The above reaction produced a polyurethane resin having a hydroxyl group and an imide linkage. The obtained polyurethane resin was 8200 in number average molecular weight, 4.02 in the degree of dispersion, and 6.5 mgKOH/g in acid value and 28.4 mgKOH/g in hydroxyl value of solid content.

Comparative Synthesis Example 8

In a reaction container equipped with a stirring device, a thermometer, and a condenser, 271.06 (0.30 mol) of ETERNACOLL UM-90 (1/1) was put, and with the addition of 60.06 (0.24 mol) of MILLIONATE MT (from Nippon Polyurethane Industry Co., Ltd.), 27.87 g (0.16 mol) of Cosmonate T-80 (from Mitsui Chemicals Polyurethanes, Inc.), and 382.60 g of γ-butyrolactone, all of the raw materials were dissolved at 150° C., and reacted for 4 hours to produce a polyisocyanate having an urethane group. Then, the temperature of the reaction solution was lowered down to 60° C., 19.21 g (0.10 mol) of trimellitic anhydride was added and dissolved completely, and then, the temperature was increased up to 120° C. to dissolve all of the raw materials, and react the materials for 1 hour.

The temperature of the reaction solution was increased up to 180° C. to develop a reaction at 180° C. for 2 hours, at 150° C. for 4 hours, and at 130° C. for 1 hour. Subsequently, 4.40 g of 2-butanone oxime was added at 110° C. to terminate the reaction.

The obtained polyurethane resin having an amide linkage and an imide linkage was 12800 in number average molecular weight, 2.90 in the degree of dispersion, and 4.1 mgKOH/g in acid value of solid content.

Tables 1, 2, 3, 4, and 5 show the amounts of raw materials put and acid values for each urethane resin all together. In the tables, the numerical values in parentheses represent molar ratios.

TABLE 1

| | | Synthesis Example | | | | | | |
|---|---|---|---|---|---|---|---|---|
| | | 1 | 2 | 3 | 4 | 5 | 6 | 7 |
| Diol | UM-CARB90(3/1) | 156.98 (0.175) | — | — | — | — | 91.52 (0.10) | — |
| | UM-CARB90(1/1) | — | 158.12 (0.175) | — | 79.06 (0.088) | 67.77 (0.075) | — | 91.37 (0.10) |
| | UM-CARB90(1/3) | — | — | 156.48 (0.175) | — | — | — | — |
| | 1,4-Cyclohexane dimethanol | — | — | — | — | — | — | — |
| | PCDL T-6001 | — | — | — | 85.53 (0.088) | — | — | — |
| | PCDL T-6002 | — | — | — | — | 148.96 (0.075) | 99.51 (0.05) | 99.51 (0.05) |
| | PLACCEL CD-220 | — | — | — | — | — | — | — |
| Polyisocyanate | Desmodur-W | 137.55 (0.525) | 137.55 (0.525) | 137.55 (0.525) | 137.55 (0.525) | 117.90 (0.45) | 117.90 (0.45) | 117.90 (0.45) |
| | MILLIONATE MT | — | — | — | — | — | — | — |
| | Cosmonate T-80 | — | — | — | — | — | — | — |
| Acid | Trimellitic anhydride | 33.60 (0.175) | 33.60 (0.175) | 33.60 (0.175) | 33.60 (0.175) | 28.80 (0.15) | 28.80 (0.15) | 28.80 (0.15) |
| | Dimethylolpropionic acid | — | — | — | — | — | — | — |
| Alcohol | G-1000 | — | — | — | — | — | — | — |
| | Neopentyl glycol | 16.40 (0.158) | 16.40 (0.158) | 16.40 (0.158) | 16.40 (0.158) | 14.06 (0.135) | 14.06 (0.135) | 14.06 (0.135) |
| | Glycerin | 9.67 (0.105) | 9.67 (0.105) | 9.67 (0.105) | 9.67 (0.105) | 8.29 (0.09) | 8.29 (0.09) | 8.29 (0.09) |
| | 2-Butanone oxime | — | — | — | — | — | — | — |
| Solvent | γ-Butyrolactone | 354.21 | 355.34 | 353.71 | 361.82 | 385.78 | 360.07 | 359.93 |
| Acid value(mgKOH/g) | | 27 | 27 | 28 | 27 | 22 | 23 | 23 |
| Ratio of constitutional unit derived from 1,4-cyclohexanedimethanol (mass %) | | 21.7 | 14.2 | 6.9 | 7 | 5.6 | 12.4 | 8.1 |

TABLE 2

| | | Synthesis Example | | | | | |
|---|---|---|---|---|---|---|---|
| | | 8 | 9 | 10 | 11 | 12 | 13 |
| Diol | UM-CARB90(3/1) | — | — | — | — | — | — |
| | UM-CARB90(1/1) | 161.44 (0.179) | 71.79 (0.079) | 158.12 (0.175) | 121.47 (0.133) | 88.03 (0.096) | — |
| | UM-CARB90(1/3) | — | — | — | — | — | — |
| | 1,4-Cyclohexane dimethanol | — | — | — | — | — | 30.93 (0.215) |
| | PCDL T-6001 | — | — | — | — | — | 30.21 (0.031) |
| | PCDL T-6002 | — | — | — | — | 191.17 (0.096) | 69.72 (0.035) |
| | PLACCEL CD-220 | — | 158.34 (0.079) | 348.76 (0.175) | 132.91 (0.067) | — | — |
| Polyisocyanate | Desmodur-W | — | — | — | — | — | — |
| | MILLIONATE MT | 76.55 (0.306) | 68.17 (0.272) | 150.16 (0.60) | 85.59 (0.342) | 82.59 (0.33) | 97.75 (0.391) |
| | Cosmonate T-80 | 35.56 (0.204) | 31.63 (0.182) | 69.66 (0.40) | 39.71 (0.228) | 38.32 (0.22) | 45.35 (0.261) |
| Acid | Trimellitic anhydride | 63.71 (0.332) | 56.66 (0.295) | 124.80 (0.65) | 71.14 (0.371) | 68.64 (0.378) | 71.14 (0.371) |
| | Dimethylolpropionic acid | — | — | — | — | — | — |

TABLE 2-continued

|  |  | Synthesis Example | | | | | |
|---|---|---|---|---|---|---|---|
|  |  | 8 | 9 | 10 | 11 | 12 | 13 |
| Alcohol | G-1000 | — | — | — | — | — | — |
|  | Neopentyl glycol | — | — | — | — | — | — |
|  | Glycerin | — | — | — | — | — | — |
|  | 2-Butanone oxime | 5.61 | 4.99 | 10.99 | 6.26 | 6.05 | 7.16 |
| Solvent | γ-Butyrolactone | 342.98 | 391.57 | 862.49 | 457.07 | 474.79 | 352.25 |
| Acid value(mgKOH/g) |  | 31 | 26 | 19 | 20 | 21 | 28 |
| Ratio of constitutional unit derived from 1,4-cyclohexanedimethanol (mass %) |  | 15 | 5.8 | 5.8 | 8.5 | 5.9 | 6.7 |

TABLE 3

|  |  | Synthesis Example | |
|---|---|---|---|
|  |  | 14 | 15 |
| Diol | UM-CARB90(3/1) | — | — |
|  | UM-CARB90(1/1) | 128.03 (0.140) | 238.88 (0.268) |
|  | UM-CARB90(1/3) | — | — |
|  | 1,4-Cyclohexanedimethanol | — | — |
|  | PCDL T-6001 | — | — |
|  | PCDL T-6002 | — | — |
|  | PLACCEL CD-220 | 141.28 (0.070) | — |
| Polyisocyanate | Desmodur-W | — | 110.04 (0.420) |
|  | MILLIONATE MT | 59.58 (0.336) | — |
|  | Cosmonate T-80 | 39.01 (0.224) | — |
| Acid | Trimellitic anhydride | 67.25 (0.350) | — |
|  | Dimethylolpropionic acid | — | 17.71 (0.132) |
| Alcohol | G-1000 | — | — |
|  | Neopentyl glycol | — | — |
|  | Glycerin | — | — |
|  | 2-Butanone oxime | 6.16 | 4.04 |
| Solvent | γ-Butyrolactone | 465.83 | 370.67 |
| Acid value(mgKOH/g) |  | 13.3 | 20.0 |
| Ratio of constitutional unit derived from 1,4-cyclohexanedimethanol (mass %) |  | 8.7 | 20.5 |

TABLE 4

|  |  | Comparative Synthesis Example | | | |
|---|---|---|---|---|---|
|  |  | 1 | 2 | 3 | 4 |
| Diol | UM-CARB90(3/1) | — | 316.24 (0.35) | — | — |
|  | UM-CARB90(1/1) | — | — | — | — |
|  | UM-CARB90(1/3) | — | — | — | — |
|  | 1,4-Cyclohexane dimethanol | — | — | — | — |
|  | PCDL T-6001 | 194.96 (0.20) | — | 171.07 (0.175) | — |
|  | PCDL T-6002 | — | — | — | — |
|  | PLACCEL CD-220 | 302.15 (0.15) | — | — | 687.86 (0.35) |
| Polyisocyanate | Desmodur-W | 275.10 (1.05) | 275.10 (1.05) | 137.55 (0.525) | — |
|  | MILLIONATE MT | — | — | — | 150.16 (0.60) |
|  | Cosmonate T-80 | — | — | — | 69.66 (0.40) |
| Acid | Trimellitic anhydride | — | — | 33.60 (0.175) | 124.80 (0.65) |
|  | Dimethylolpropionic acid | 79.75 (0.5945) | 79.75 (0.5945) | — | — |
| Alcohol | G-1000 | 78.81 (0.0555) | 78.81 (0.0555) | — | — |
|  | Neopentyl glycol | — | — | 16.40 (0.158) | — |
|  | Glycerin | — | — | 9.67 (0.105) | — |
|  | 2-Butanone oxime | 10.01 | 10.01 | — | 10.99 |
| Solvent | γ-Butyrolactone | 930.77 | 759.91 | 368.29 | 1043.47 |
| Acid value(mgKOH/g) |  | 36.2 | 37 | 27 | 18 |
| Ratio of constitutional unit derived from 1,4-cyclohexanedimethanol (mass %) |  | 0 | 20.3 | 0 | 0 |

TABLE 5

|  |  | Comparative Synthesis Example | | | |
|---|---|---|---|---|---|
|  |  | 5 | 6 | 7 | 8 |
| Diol | UM-CARB90(3/1) | — | — | — | — |
|  | UM-CARB90(1/1) | 171.58 (0.193) | 418.93 (0.470) | 225.89 (0.250) | 271.06 (0.300) |
|  | UM-CARB90(1/3) | — | — | — | — |
|  | 1,4-Cyclohexane dimethanol | — | — | — | — |
|  | PCDL T-6001 | — | — | — | — |
|  | PCDL T-6002 | — | — | — | — |
|  | PLACCEL CD-220 | — | — | — | — |
| Polyisocyanate | Desmodur-W | 151.31 (0.578) | 137.55 (0.525) | 144.1 (0.550) | — |
|  | MILLIONATE MT | — | — | — | 60.06 (0.240) |
|  | Cosmonate T-80 | — | — | — | 27.87 (0.160) |
| Acid | Trimellitic anhydride | — | — | 9.60 (0.050) | 19.21 (0.100) |
|  | Dimethylolpropionic acid | 47.96 (0.992) | 4.02 (0.030) | — | — |
| Alcohol | G-1000 | — | — | — | — |
|  | Neopentyl glycol | — | — | 34.37 (0.330) | — |
|  | Glycerin | — | — | 20.26 (0.220) | — |
|  | 2-Butanone oxime | 5.55 | 5.05 | — | 4.40 |
| Solvent | γ-Butyrolactone | 376.40 | 565.55 | 434.22 | 382.60 |
| Acid value(mgKOH/g) |  | 53.3 | 3.0 | 6.5 | 4.1 |
| Ratio of constitutional unit derived from 1,4-cyclohexanedimethanol (mass %) |  | 14.5 | 23.6 | 18.7 | 22.5 |

2. Preparation of Thermosetting Resin Composition

The polyurethane resins obtained in the above synthesis examples and comparative synthesis examples, Epotohto YH-434L (from Tohto Kasei Co., Ltd.) as an epoxy resin (tetraglycidylaminodiphenylmethane), BL-3175 (from Sumitomo Bayer Urethane Co., Ltd.) as a blocked isocyanate, γ-butyrolactone (from Mitsubishi Chemical Corporation), and 0.3 parts by weight of BYK-A555 (from BYK Japan KK, Trade Name) as an antifoaming agent were mixed in flasks, and kneaded with a U-shaped vane to adjust thermosetting resin compositions. Tables 6 and 7 show ratios (parts by weight) for each constituent.

TABLE 6

|  |  | Example | | | | | | | | | | | | | | |
|---|---|---|---|---|---|---|---|---|---|---|---|---|---|---|---|
|  |  | 1 | 2 | 3 | 4 | 5 | 6 | 7 | 8 | 9 | 10 | 11 | 12 | 13 | 14 | 15 |
| Polyurethane resin | Synthesis Example 1 | 90 | | | | | | | | | | | | | | |
|  | Synthesis Example 2 | | 90 | | | | | | | | | | | | | |
|  | Synthesis Example 3 | | | 90 | | | | | | | | | | | | |
|  | Synthesis Example 4 | | | | 90 | | | | | | | | | | | |
|  | Synthesis Example 5 | | | | | 90 | | | | | | | | | | |
|  | Synthesis Example 6 | | | | | | 91 | | | | | | | | | |
|  | Synthesis Example 7 | | | | | | | 91 | | | | | | | | |
|  | Synthesis Example 8 | | | | | | | | 95 | | | | | | | |
|  | Synthesis Example 9 | | | | | | | | | 95 | | | | | | |
|  | Synthesis Example 10 | | | | | | | | | | 95 | | | | | |
|  | Synthesis Example 11 | | | | | | | | | | | 95 | | | | |
|  | Synthesis Example 12 | | | | | | | | | | | | 95 | | | |
|  | Synthesis Example 13 | | | | | | | | | | | | | 95 | | |
|  | Synthesis Example 14 | | | | | | | | | | | | | | 95 | |
|  | Synthesis Example 15 | | | | | | | | | | | | | | | 95 |

TABLE 6-continued

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Epoxy resin | YH-434L | 5 | 5 | 5 | 5 | 4 | 4.5 | 4.5 | 6.5 | 5 | 4 | 4 | 4 | 5 | 2.5 | 4 |
| Blocked isocyanate | BL-3175 | 5 | 5 | 5 | 5 | 4 | 4.5 | 4.5 | — | — | — | — | — | — | — | — |
| Solvent | γ-Butyrolactone | 20 | 20 | 20 | 20 | 20 | 20 | 20 | 20 | 20 | 20 | 20 | 20 | 20 | 20 | 20 |

TABLE 7

| | | Comparative Example | | | | | | | |
|---|---|---|---|---|---|---|---|---|---|
| | | 1 | 2 | 3 | 4 | 5 | 6 | 7 | 8 |
| Polyurethane resin | Comparative Synthesis Example 1 | 95 | | | | | | | |
| | Comparative Synthesis Example 2 | | 95 | | | | | | |
| | Comparative Synthesis Example 3 | | | 90 | | | | | |
| | Comparative Synthesis Example 4 | | | | 95 | | | | |
| | Comparative Synthesis Example 5 | | | | | 95 | | | |
| | Comparative Synthesis Example 6 | | | | | | 95 | | |
| | Comparative Synthesis Example 7 | | | | | | | 90 | |
| | Comparative Synthesis Example 8 | | | | | | | | 95 |
| Epoxy resin | YH-434L | 7 | 7 | 5 | 4 | 7 | 1 | 1 | 1 |
| Blocked isocyanate | BL-3175 | — | — | 5 | — | — | — | 8 | — |
| Solvent | γ-Butyrolactone | 20 | 20 | 20 | 20 | 20 | 20 | 20 | 20 |

3. Evaluation (1) Insulation Reliability

HHBT (High temperature High humidity Bias Test)

A flexible copper-clad laminated plate (Copper Wiring Width/Copper Wiring-Copper Wiring Width=15 μm/15 μm) was prepared which was composed of a polyimide film of 38 μm in thickness and a comb-like copper wiring (wiring pattern) including copper foil (sputtered copper) of 8 μm in thickness and a Sn plating layer of 0.2 to 0.3 μm in thickness formed on the copper foil. To this flexible copper-clad laminated plate, each thermosetting resin composition was applied by screen printing with the use of a SUS 200 mesh plate so that the dried film thickness was 10 μm. The applied thermosetting resin composition was cured by heating at 120° C. for 1 hour, and then further heated at 125° C. for 7.5 hours for the prevention of an uncured state to form a protective film. A bias voltage of 100 V was applied to the substrate with the protective film formed in an atmosphere at 65° C. and a relative humidity of 95% to evaluate the HHBT resistance value by the following standards. The following values are average value for resistance values from the start of the measurement until a lapse of 100 hours.

A: $1.0 \times 10^{12} \Omega$ or more
B: $5.0 \times 10^{11} \Omega$ or more, and less than $1.0 \times 10^{12} \Omega$
C: $1.0 \times 10^{11} \Omega$ or more, and less than $5.0 \times 10^{11} \Omega$
D: $5.0 \times 10^{10} \Omega$ or more, and less than $1.0 \times 10^{11} \Omega$
E: $1.0 \times 10^{10} \Omega$ or more, and less than $5.0 \times 10^{10} \Omega$
F: less than $1.0 \times 10^{10} \Omega$ PCBT (Pressure Cooker Bias Test)

A flexible copper-clad laminated plate (Copper Wiring Width/Copper Wiring-Copper Wiring Width=12.5 μm/12.5 μm) was prepared which was composed of a polyimide film of 38 μm in thickness and a comb-like copper wiring (wiring pattern) including copper foil (sputtered copper) of 8 μm in thickness and a Sn plating layer of 0.2 to 0.3 μm in thickness formed on the copper foil. To this flexible copper-clad laminated plate, each thermosetting resin composition was applied by screen printing with the use of a SUS 200 mesh block so that the dried film thickness was 10 μm. The applied thermosetting resin composition was cured by heating at 120° C. for 1 hour to form a protective film. A bias voltage of 100 V was applied to the substrate with the protective film formed in an atmosphere at 120° C. and a relative humidity of 85% to measure the time until the generation of migration, and evaluate the insulation reliability by the following standards.

A: 300 hours or more
B: 200 hours or more, less than 300 hours
C: 150 hours or more, less than 200 hours
D: 100 hours or more, less than 150 hours
E: 50 hours or more, less than 100 hours
F: less than 50 hours (2) Warpage Behavior A flexible copper-clad laminated plate (48 mm long, 35 mm wide) was prepared which was composed of a polyimide film of 38 μm in thickness and a copper wiring (wiring pattern) including copper foil (sputtered copper) of 8 μm in thickness and a Sn plating layer of 0.2 to 0.3 μm in thickness formed on the copper foil. To this flexible copper-clad laminated plate, each thermosetting resin composition was applied up to a film thickness so that the thickness after curing was 10 μm. The applied thermosetting resin composition was cured by heating at 120° C. for 60 minutes, and then at 150° C. for 4 hours to form a protective film. The flexible copper-clad laminated plate with the protective film formed was placed on a surface plate with the surface of the protective film down to measure the distance (mm) from the surface plate to the top of warpage of the flexible copper-clad laminated plate, and the measured value was defined as height of the warpage. On the basis of the measured height of the warpage, the warpage behavior was evaluated on the following two-point scale.

A: less than 4.0 mm
B: 4.0 mm or more, and less than 6.0 mm
C, 6.0 mm or more, and less than 8.0 mm
D: 8.0 mm or more (3) Glass Transition Temperature Each thermosetting resin composition was applied by an applicator onto a release PET film, and cured by heating at 120° C. for 60 minutes. The cured coating film (film thickness: approximately: 30 μm) was cut with a razor into a size of 4 mm×20 mm, and then peeled from the release PET film. The obtained test specimen was used to measure the glass transition temperature under the following conditions with the use of a thermo-mechanical analyzer (TMA).
Length between Chucks: 10 mm
Rate of Temperature Increase: 10° C./min
Load: 3 gf (4) Water Absorption Rate The water absorption rate was measured according to the following procedure.

i) A glass plate (100 mm×100 mm) is subjected to ultrasonic cleaning in acetone, and the mass (W1) of the glass plate was precisely weighed with a precision balance.

ii) The end of 5 mm of a glass plate (75 mm×75 mm) is covered by masking, and the thermosetting resin composition is applied onto the glass plate so that the dried film thickness is 20 μm. After the application, the masking is removed, and the coating film is cured by heating at 120° C. for 60 minutes to obtain a test specimen. The mass (W2) of the test specimen is precisely weighed with a precision balance.

iii) The test specimen is immersed in ion exchange water at 25° C. for 24 hours, and after removing the moisture attached to the test specimen pulled out from the ion exchange water, the mass (W3) of the test specimen is precisely weighed.

iv) The water absorption rate was calculated from the following calculation formula for the evaluation on the following 4-point scale. Calculation Formula:

$$\text{Water Absorption Rate [\%]} = \{(W3-W2)/(W2-W1)\} \times 100$$

A: less than 1.0%
B: 1.0% or more, and less than 1.5%
C: 1.5% or more, and less than 2.0%
D: 2.0% or more (5) Elastic Modulus, Elongation Percentage Each thermosetting resin composition was applied by an applicator onto a release PET film, and cured by heating at 120° C. for 60 minutes. The cured coating film (film thickness: approximately: 30 μm) was cut with a razor into a strip of 10 mm in width (approximately 60 mm in length), and then peeled from the release PET film. For the obtained test specimen, a tensile test was carried out under the following conditions with the use of a precise universal testing instrument (autograph, from Shimadzu Corporation, Model Number: "AGS-5KNG") to measure the elastic modulus and elongation percentage.
Tension Condition Length between Chucks 20 mm
Tension Rate: 5 mm/min (6) (1) Flexibility-1 (MIT (Massachusetts Institute of Technology) Test)

A flexible copper-clad laminated plate (48 mm long, 35 mm wide, Copper Wiring Width/Copper Wiring-Copper Wiring Width=15 μm/15 μm) was prepared which was composed of a polyimide film of 38 μm in thickness and a comb-like copper wiring (wiring pattern) including copper foil (sputtered copper) of 8 μm in thickness and a Sn plating layer of 0.2 to 0.3 μm in thickness formed on the copper foil. To the substrate of this flexible copper-clad laminated plate, each thermosetting resin composition was applied by screen printing with the use of a SUS 200 mesh block so that the dried film thickness was 10 μm, and cured by heating at 120° C. for 1 hour, and then at 125° C. for 7.5 hours to obtain a test specimen in the form shown in FIG. 1. The cured test specimen was folded in position A with the protective film inside repeatedly under the following conditions with the use of a MIT testing machine to find the number of cycles with which electrical conduction was not confirmed. The flexibility was evaluated on the following 5-point scale.
MIT Resistance Test Condition
Load: 100 gf
Angle: Opposed Angle 135°
Speed: 175 times/min
Tip: R 0.38 mm Cylinder
Evaluation Criteria
A: 80 times or more
B: 60 times or more, less than 80 times
C: 50 times or more, less than 60 times
D: 40 times or more, less than 50 times
E: less than 40 times (6) (ii) Flexibility-2

A flexible copper-clad laminated plate (48 mm long, 35 mm wide, Copper Wiring Width/Copper Wiring-Copper Wiring Width=12.5 μm/12.5 μm) was prepared which was composed of a polyimide film of 38 μm in thickness and a comb-like copper wiring (wiring pattern) including copper foil (sputtered copper) of 8 μm in thickness and a Sn plating layer of 0.2 to 0.3 μm in thickness formed on the copper foil. To the substrate of this flexible copper-clad laminated plate, each thermosetting resin composition was applied by screen printing with the use of a SUS 200 mesh block so that the dried film thickness was 10 μm, and cured by heating at 120° C. for 1 hour, and then at 125° C. for 7.5 hours to obtain a test specimen in the form shown in FIG. 1. The cured test specimen was folded in position A with the protective film inside repeatedly under the following conditions with the use of a MIT testing machine to find the number of cycles with which electrical conduction was not confirmed. The flexibility was evaluated on the following 5-point scale.
MIT Resistance Test Condition
Load: 100 gf
Angle: Opposed Angle 135°
Speed: 175 times/min
Tip: R 1.0 mm Cylinder
Evaluation Criteria
A: 200 times or more
B: 150 times or more, less than 200 times
C: 100 times or more, less than 150 times
D: 80 times or more, less than 100 times
E: less than 80 times (7) Adhesion To a substrate of a flexible copper-clad laminated plate (Copper Wiring Width/Copper Wiring-Copper Wiring Width=15 μm/15 μm), each thermosetting resin composition was applied by screen printing with the use of a SUS 200 mesh block so that the dried film thickness was 10 μm with 15 mm long×40 mm wide, and cured by heating at 120° C. for 1 hour. After the curing, a cross-cut test was carried out for a plane of specimen to evaluate the degree of peeling for the cured film. The cross-cut test was carried out by expressing the number of remaining squares with respect to 100 squares in a grid according to JIS K5600. The adhesion was evaluated on the following 3-point scale.

A: 100/100 (No Peeling=Favorable Adhesion)
B: 99/100 to 95/100
C: <95/100

(8) Tackiness

The thermosetting resin composition was printed continuously by screen printing at a coating film interval of 5 cm onto a polyimide film of 50 mm in width with the use of a SUS 200 mesh block so that the dried film thickness was 10 μm and the coating film was 15 mm long×40 mm wide. The printed film was cured by heating 120° C. for 1 hour. The continuously printed polyimide film was winded up by a roll while applying a load of 500 g. By leaving 48 hours under an atmosphere at 25° C. and a relative humidity of 60%, the attachment load of the contact surface was evaluated by the following standards between the printing surface of the thermosetting resin composition and the rear surface of the polyimide film. For the attachment load, the load with which the polyimide film was peeled from the printing surface of the thermosetting resin composition was measured, and evaluated on the following 3-point scale.

Attachment Load
A: 0.23 g or less
B: more than 0.23 g, and 1.00 g or less
C: more than 1.00 g (8) Weather Resistance (PCT (Pressure Cooker Test) Resistance)

To a comb-like substrate of a flexible copper-clad laminated plate (Copper Wiring Width/Copper Wiring-Copper Wiring Width=15 μm/15 μm), each thermosetting resin composition was applied by screen printing with the use of a SUS 200 mesh block so that the dried film thickness was 10 μm with 15 mm long x 40 mm wide, and cured by heating at 120° C. for 1 hour. The cured test specimen was subjected to an autoclave treatment under the conditions of 121° C. and 0.2 MPa (saturated vapor pressure) to observe the appearance of the coating film after 100 hours. The appearance of the coating film was evaluated on the following 3-point scale.

A: No Bulge, Crack, or Rough Surface (Good)
B: Rough Surface
C: Bulge and Crack

TABLE 8

| Item | Example | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| HHBT Resistance value | A | A | C | C | C | B | C | A | B | C | B | C | A | B | C |
| PCBT Endurance time | A | A | B | C | C | B | B | A | A | B | A | B | A | A | B |
| Warpage behavior | B | B | B | B | A | B | A | B | A | A | A | A | B | A | B |
| Glass transition temperature (° C.) | 100 | 95 | 85 | 72 | 70 | 80 | 75 | 103 | 85 | 80 | 86 | 81 | 110 | 80 | 72 |
| Water absorption rate | A | A | B | B | B | B | B | A | A | B | A | B | A | A | A |
| Tensile elasticity (MPa) | 1720 | 1680 | 1450 | 700 | 300 | 650 | 400 | 1950 | 200 | 170 | 500 | 160 | 2500 | 440 | 360 |
| Elongation percentage (%) | 15 | 20 | 120 | 140 | 200 | 160 | 190 | 100 | 220 | 230 | 280 | 220 | 110 | 290 | 180 |
| Flexibility-1 (MIT resistance) | B | B | B | B | B | A | A | A | B | B | A | B | A | A | B |
| Flexibility-2 (MIT resistance) | C | C | C | C | C | C | C | A | B | B | A | B | A | A | C |
| Adhesion | B | B | B | A | A | A | A | A | A | A | A | A | A | A | B |
| Tackiness | A | A | A | A | A | A | A | A | A | A | A | A | A | A | A |
| Weather resistance (PCT resistance) | C | C | C | C | C | C | C | A | A | A | A | A | A | A | B |

TABLE 9

| Item | Comparative Example | | | | | | | |
|---|---|---|---|---|---|---|---|---|
| | 1 | 2 | 3 | 4 | 5 | 6 | 7 | 8 |
| HHBT Resistance value | D | D | E | D | C | D | D | C |
| PCBT Endurance time | D | D | D | E | C | F | F | F |
| Warpage behavior | A | C | A | A | D | A | A | A |
| Glass transition temperature (° C.) | 55 | 70 | 55 | 50 | 80 | 40 | 42 | 51 |
| Water absorption rate | C | B | C | C | A | C | C | C |
| Tensile elasticity (MPa) | 120 | 900 | 150 | 20 | 1640 | 210 | 310 | 200 |
| Elongation percentage (%) | 210 | 40 | 280 | 320 | 20 | 240 | 220 | 280 |

TABLE 9-continued

| Item | Comparative Example | | | | | | | |
|---|---|---|---|---|---|---|---|---|
| | 1 | 2 | 3 | 4 | 5 | 6 | 7 | 8 |
| Flexibility-1 (MIT resistance) | E | D | C | C | C | E | D | D |
| Flexibility-2 (MIT resistance) | E | D | D | D | C | E | E | D |
| Adhesion | C | C | A | A | B | B | A | A |
| Tackiness | B | A | B | C | A | B | B | B |
| Weather resistance (PCT resistance) | C | B | C | B | B | C | C | C |

REFERENCE SIGNS LIST

3 . . . Base Material, 5 . . . Wiring Pattern, 7 . . . Protective Film, 100 . . . Flexible Wiring Board

The invention claimed is:

1. A thermosetting resin composition comprising:
a polyurethane resin comprising a constitutional unit derived from an alicyclic diol in an amount of 0.1 to 30 mass % of the total mass polyurethane resin, the polyurethane resin having an acid value of 10 to 31 mgKOH/g; and
a curing agent comprising an epoxy resin,
wherein the polyurethane resin has been synthesized by:
reacting a diol including an alicyclic diol or a polycarbonatediol having a constitutional unit derived from an alicyclic diol with a polyisocyanate having an isocyanate group to obtain a polyisocyanate having a urethane linkage, and reacting the polyisocyanatel having the urethane linkage with an acid anhydride; or
reacting a diol including an alicyclic diol or a polycarbonatediol having a constitutional unit derived from an alicyclic diol and a dihydroxy compound having a carboxyl group with a polyisocyanate having an isocyanate group.

2. The thermosetting resin composition according to claim 1, wherein the polyurethane resin has an amide linkage and/or an imide linkage.

3. The thermosetting resin composition according to claim 1, wherein the polyurethane resin further comprises a constitutional unit derived from a polycarbonate diol represented by the following formula (2):

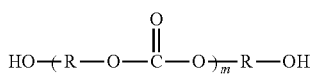

(2)

in the formula (2), R represents an alkylene group having 1 to 18 carbon atoms, and m represents an integer of 1 to 30.

4. A method for forming a protective film for a flexible wiring board, the method comprising the steps of:
printing the thermosetting resin composition according to claim 1 so as to cover at least a portion of a wiring pattern of the flexible wiring board, the wiring pattern being subjected to a Sn plating processing in advance; and
curing the printed thermosetting resin composition to form a protective film.

5. A flexible wiring board comprising a protective film formed by the method according to claim 4.

6. A method for forming a protective film for a flexible wiring board, the method comprising the steps of:
printing the thermosetting resin composition according to claim 2 so as to cover at least a portion of a wiring pattern of the flexible wiring board, the wiring pattern being subjected to a Sn plating processing in advance; and
curing the printed thermosetting resin composition to form a protective film.

7. A flexible wiring board comprising a protective film formed by the method according to claim 6.

8. A method for forming a protective film for a flexible wiring board, the method comprising the steps of:
printing the thermosetting resin composition according to claim 3 so as to cover at least a portion of a wiring pattern of the flexible wiring board, the wiring pattern being subjected to a Sn plating processing in advance; and
curing the printed thermosetting resin composition to form a protective film.

9. A flexible wiring board comprising a protective film formed by the method according to claim 8.

10. The thermosetting resin composition according to claim 1, wherein said constitutional unit derived from an alicyclic diol includes a constitutional unit derived from cyclohexanedimethanol.

11. The thermosetting resin composition according to claim 1, wherein said constitutional unit derived from an alicyclic diol includes a constitutional unit derived from 1,4-cyclohexanedimethanol.

12. The thermosetting resin composition according to claim 1, wherein said constitutional unit derived from an alicyclic diol includes a constitutional unit derived from five-membered ring diols and six-membered ring diols.

13. The thermosetting resin composition according to claim 12, wherein the polyurethane resin further comprises a constitutional unit derived from an aliphatic diol.

14. The thermosetting resin composition according to claim 2, wherein the polyurethane resin has a carboxyl group or an acid anhydride group at an end of a molecule thereof.

15. The thermosetting resin composition according to claim 1, said composition having a viscosity of 20 Pa·s to 80 Pa·s.

16. A cured product of the thermosetting resin composition according to claim 1.

17. The thermosetting resin composition according to claim 1, wherein the polyurethane resin has a number average molecular weight of 5000 to 65000.

18. The thermosetting resin composition according to claim 1, wherein the alicyclic diol comprises at least one of 1,4-cyclohexane diol and 1,4-cyclohexane dimethanol.

19. The thermosetting resin composition according to claim 1, wherein the polyurethane resin has been synthesized by:
reacting a diol including a polycarbonatediol having a constitutional unit derived from an alicyclic diol with a polyisocyanate having an isocyanate group to obtain a polyisocyanate having a urethane linkage, and reacting the polyisocyanate having the urethane linkage with an acid anhydride; or
reacting a diol including an alicyclic diol or a polycarbonatediol having a constitutional unit derived from an alicyclic diol and a dihydroxy compound having a carboxyl group with a polyisocyanate having an isocyanate group.

20. The thermosetting resin composition according to claim 1, wherein the curing agent is included in an amount of 1 to 30 mass% of a total mass of the polyurethane resin.

21. The thermosetting resin composition according to claim 1, wherein the polyurethane resin has been synthesized by reacting a diol including an alicyclic diol or a polycarbonatediol having a constitutional unit derived from an alicyclic diol with a polyisocyanate having an isocyanate group to obtain a polyisocyanate having a urethane linkage, and reacting the polyisocyanate having the urethane linkage with an acid anhydride.

22. The thermosetting resin composition according to claim 1, wherein the polyisocyanate having an isocyanate group comprises a isocyanate compound represented by the following formula (4):

  (4)

wherein X represents a divalent organic group.

23. The thermosetting resin composition according to claim 1, wherein the thermosetting resin composition comprises a property of providing a flexible copper-clad laminate plate having an MIT Flexibility-1 of 60 cycles or more, when the thermosetting resin is used to form a cured protective film having a thickness of 10 μm on the flexible copper-clad laminate plate comprising a polyimide film having a thickness of 38 μm, a comb-like copper foil wiring pattern having a thickness of 8 μm formed on the polyimide film, and a tin plating layer having a thickness of 0.2 to 0.3 μm formed on the copper foil.

24. The thermosetting resin composition according to claim 1, wherein the polyurethane resin has an acid value of 10 to 28 mgKOH/g.

* * * * *